(12) United States Patent
Hu et al.

(10) Patent No.: US 11,320,742 B2
(45) Date of Patent: May 3, 2022

(54) METHOD AND SYSTEM FOR GENERATING PHOTOMASK PATTERNS

(71) Applicant: TAIWAN SEMICONDUCTOR MANUFACTURING COMPANY LTD., Hsinchu (TW)

(72) Inventors: Yen-Tung Hu, Hsinchu County (TW); Kuan-Chi Chen, Hsinchu (TW); Ya-Hsuan Wu, Hsinchu County (TW); Shiuan-Li Lin, Kaohsiung (TW); Chih-Chung Huang, Hsinchu (TW); Chi-Ming Tsai, Taipei (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 16/433,492

(22) Filed: Jun. 6, 2019

(65) Prior Publication Data
US 2020/0133134 A1   Apr. 30, 2020

Related U.S. Application Data

(60) Provisional application No. 62/753,438, filed on Oct. 31, 2018.

(51) Int. Cl.
*G06F 30/39* (2020.01)
*G03F 7/20* (2006.01)

(52) U.S. Cl.
CPC .............. *G03F 7/705* (2013.01); *G06F 30/39* (2020.01)

(58) Field of Classification Search
CPC ........ G03F 1/36; G03F 7/70441; G03F 7/705; G03F 7/0002; G03F 1/70; G03F 1/38; G03F 7/70433; G03F 1/76; G03F 7/094; G03F 7/70425; G03F 7/7085; G03F 7/095; G03F 7/70; G03F 7/70633; G03F 7/70466; G03F 7/20; G03F 1/72; G03F 1/42; G03F 1/84; G03F 7/423; G03F 7/70983; G03F 7/70516; G03F 7/70625; G03F 1/29; G06F 30/39; G06F 2119/18; G06F 30/398; G06F 30/20; G06F 30/394; G06F 2111/04; G06F 16/93; G06F 30/00; G06F 30/367; G06F 30/392; G06F 3/04812; G06F 3/04845; G06F 30/23; G06F 30/30; G06F 30/3308; G06F 30/337; G01R 31/307; H05K 1/0266; H05K 3/064
USPC ....................................... 716/50–56
See application file for complete search history.

(56) References Cited

U.S. PATENT DOCUMENTS

| | | | |
|---|---|---|---|
| 7,681,171 B2* | 3/2010 | Chen ......................... | G03F 1/36 716/50 |
| 10,539,881 B1* | 1/2020 | Sha .......................... | G06F 30/27 |
| 2010/0086212 A1* | 4/2010 | Buck ......................... | G03F 1/00 382/195 |
| 2011/0204523 A1* | 8/2011 | Arnold ....................... | G03F 7/38 257/773 |
| 2018/0151351 A1* | 5/2018 | Lilin ......................... | G03F 7/091 |

(Continued)

*Primary Examiner* — Binh C Tat
(74) *Attorney, Agent, or Firm* — WPAT, P.C., Intellectual Property Attorneys; Anthony King

(57) ABSTRACT

The present disclosure provides a method and a system for generating photomask patterns. The system obtains a design layout image, and generates a hotspot image corresponding to the design layout image based on a hotspot detection model. The system generates two photomask patterns based on the hotspot image. The at least two photomask patterns are transferred onto a semiconductor substrate.

20 Claims, 40 Drawing Sheets

(56) References Cited

U.S. PATENT DOCUMENTS

2018/0321581 A1\* 11/2018 Chou ..................... G03F 1/58
2019/0102507 A1\* 4/2019 Tan ................... G06F 30/398

\* cited by examiner

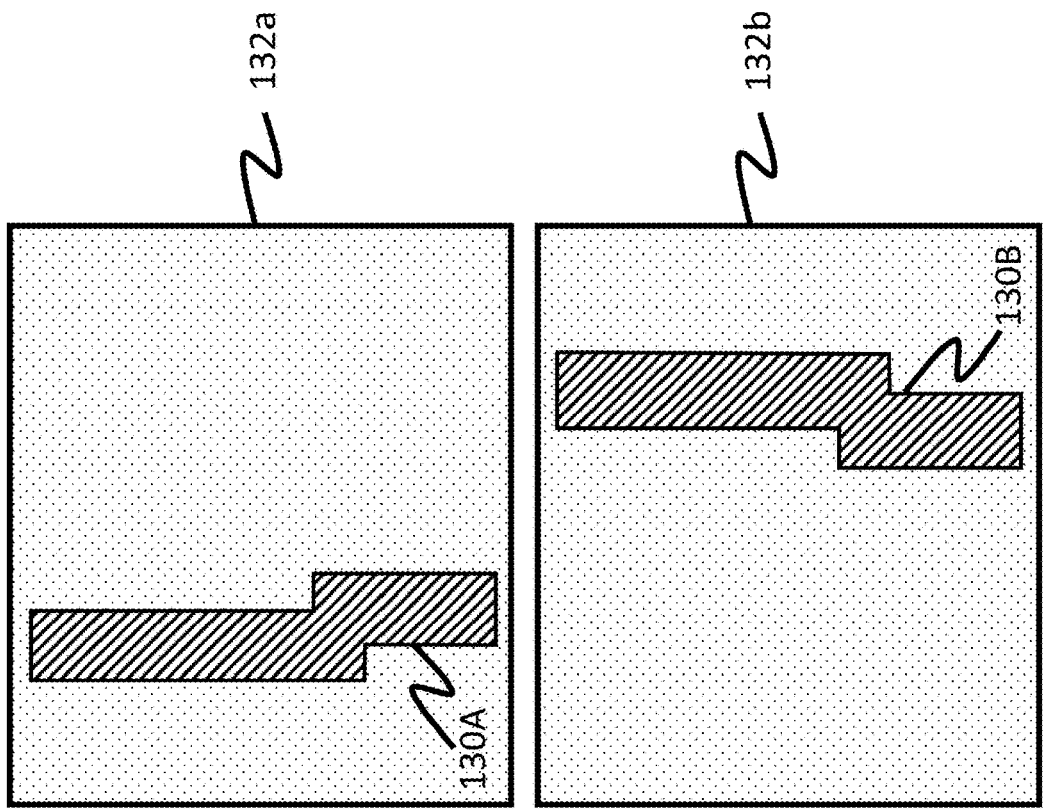
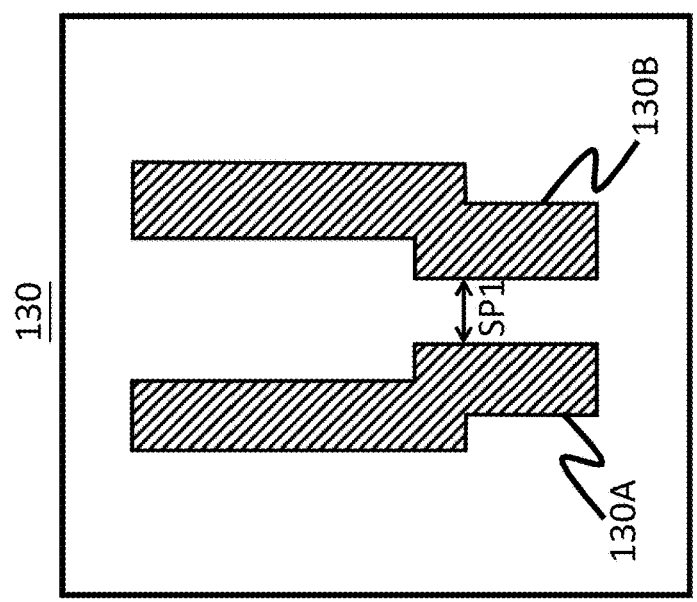
FIG. 1B

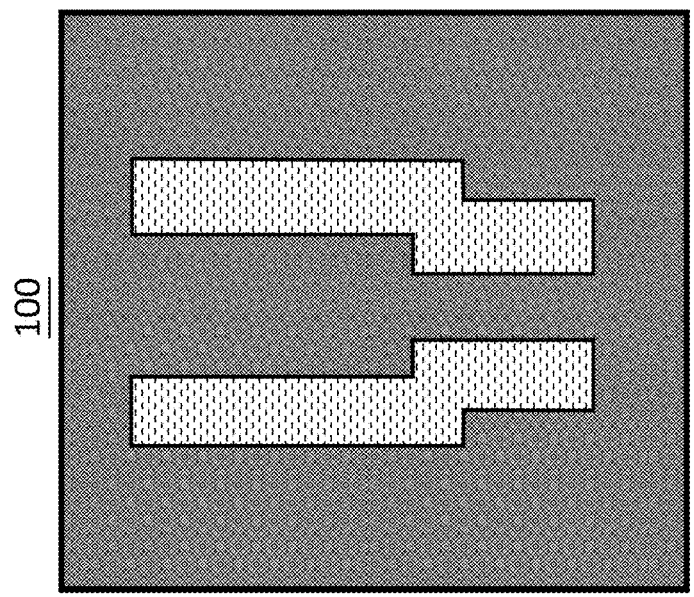
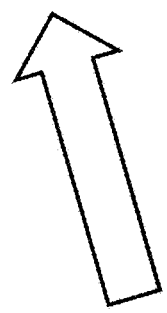
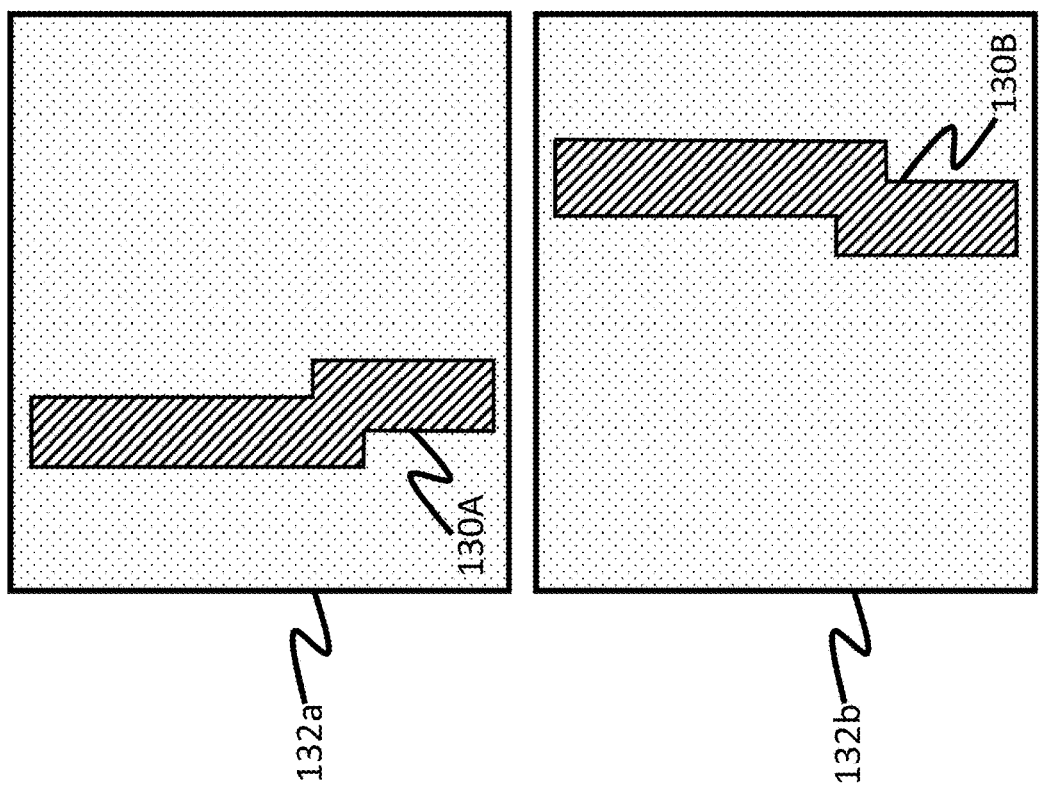
FIG. 1C

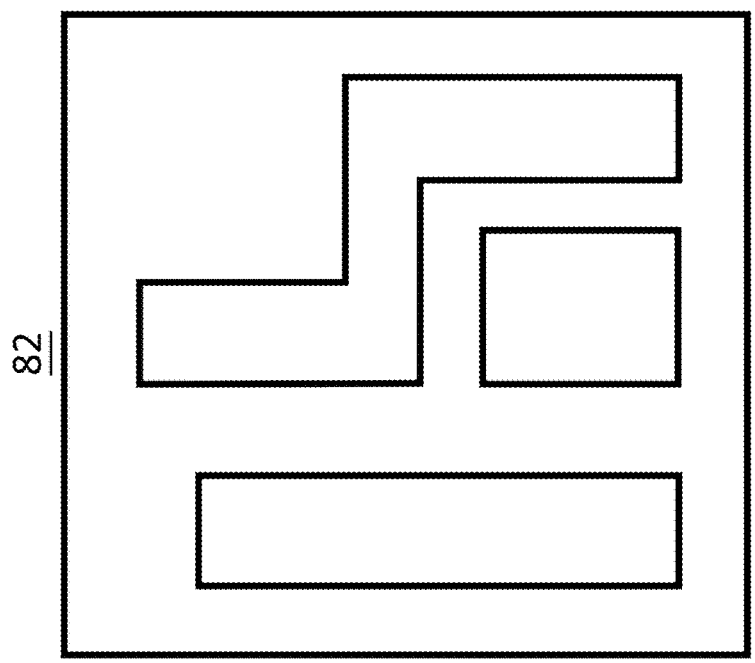
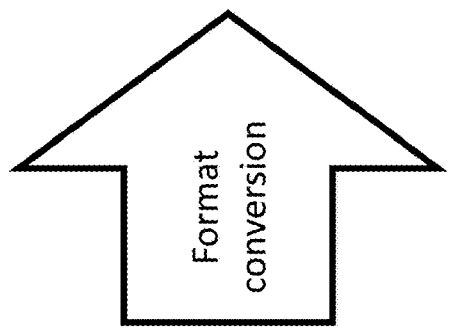
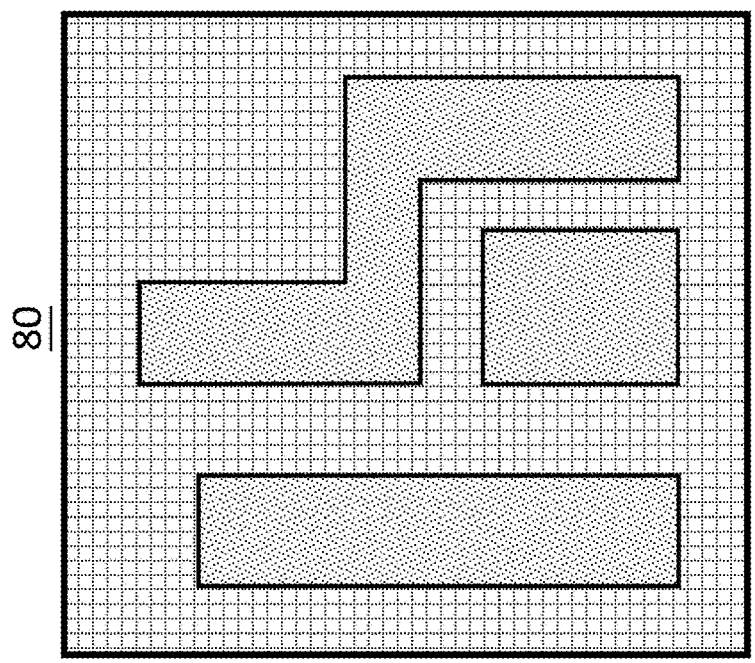
FIG. 2B

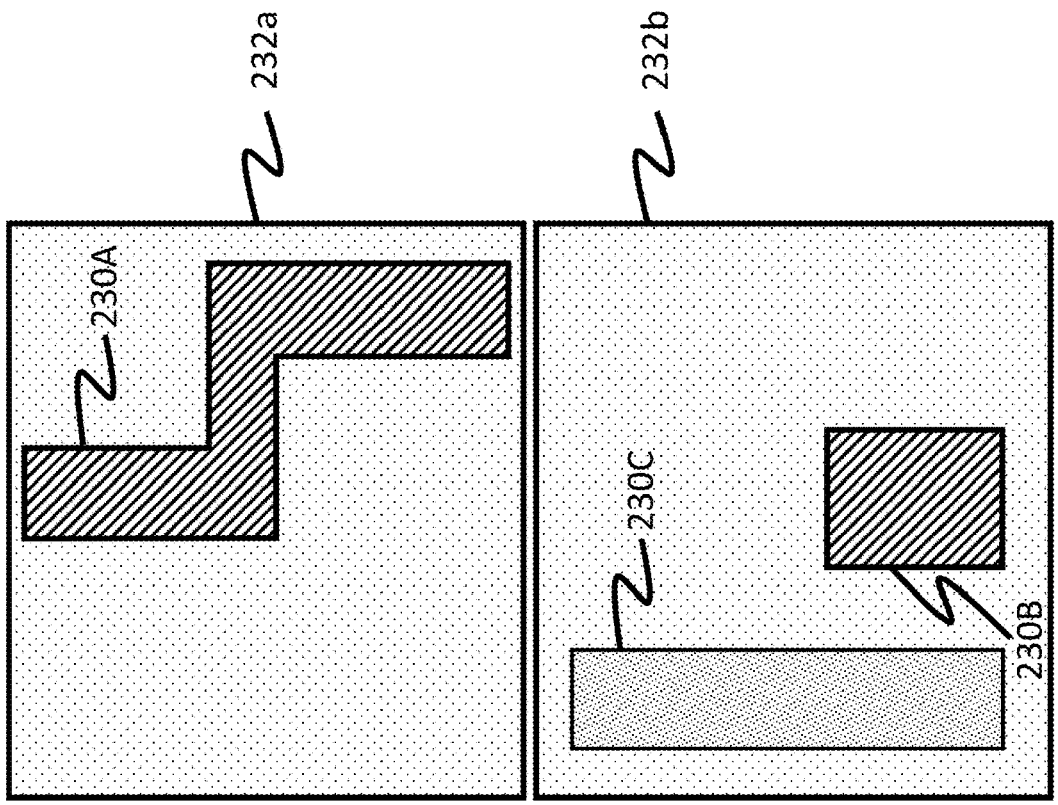
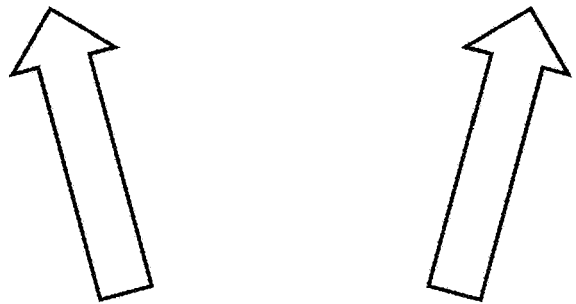
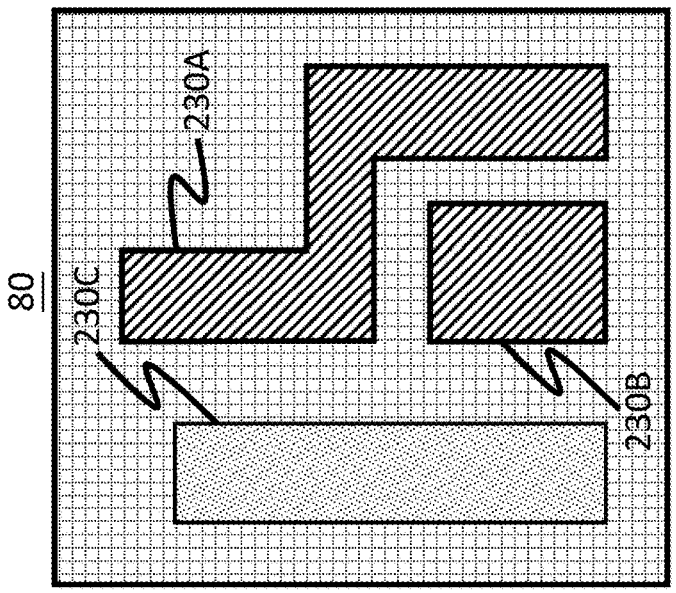
FIG. 2F

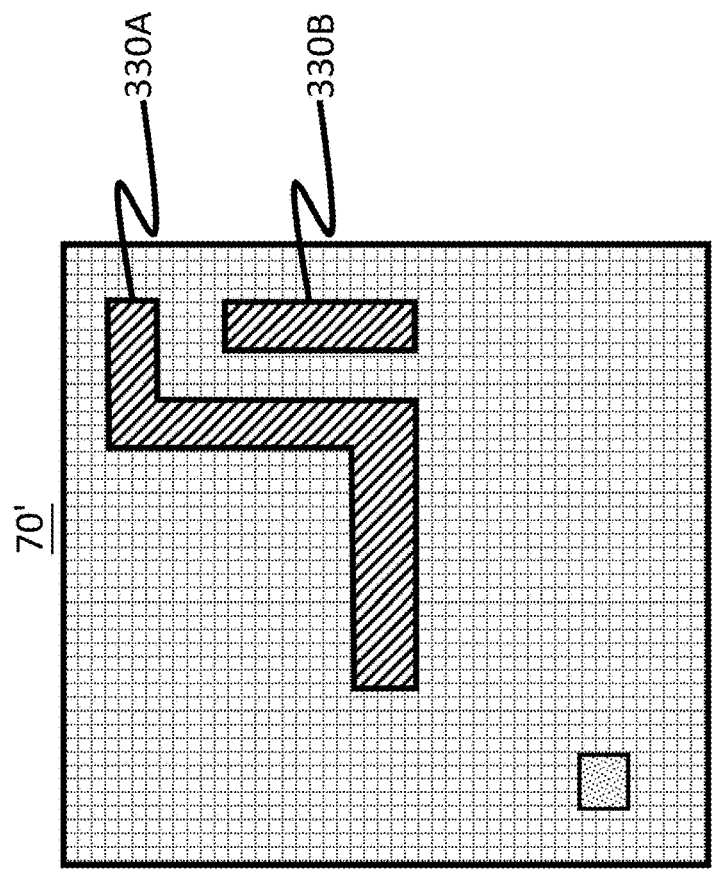
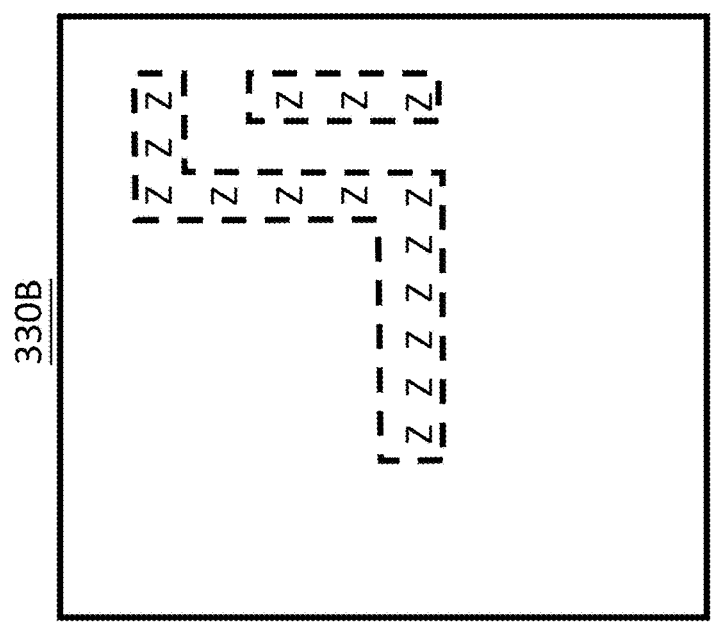
FIG. 3G

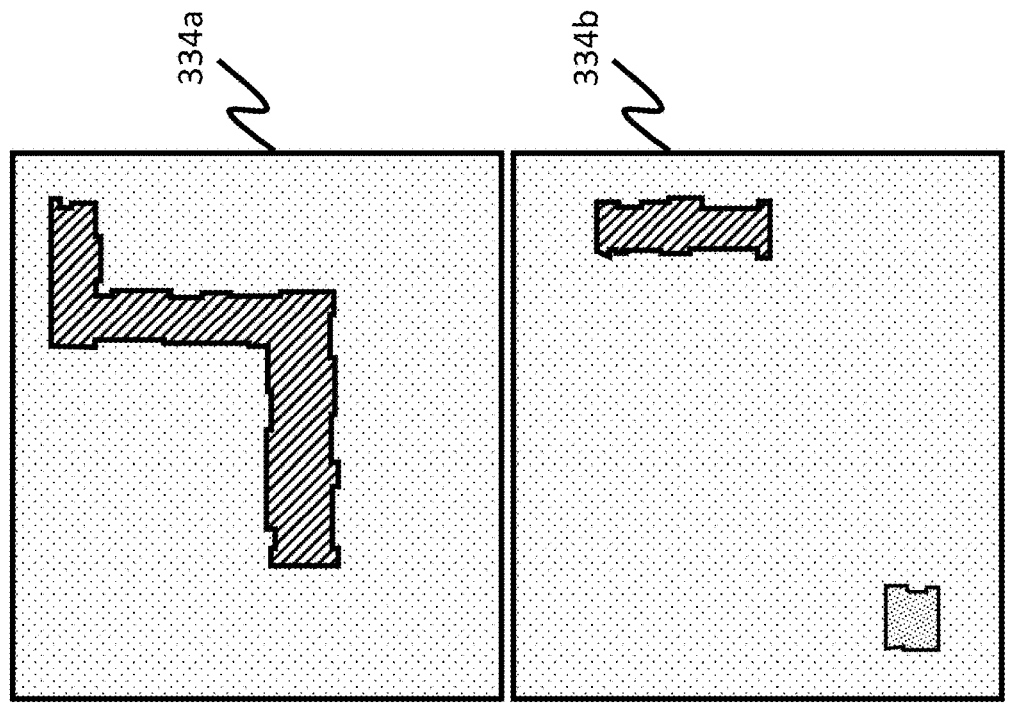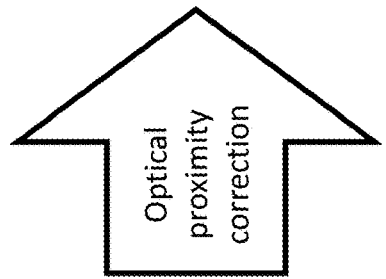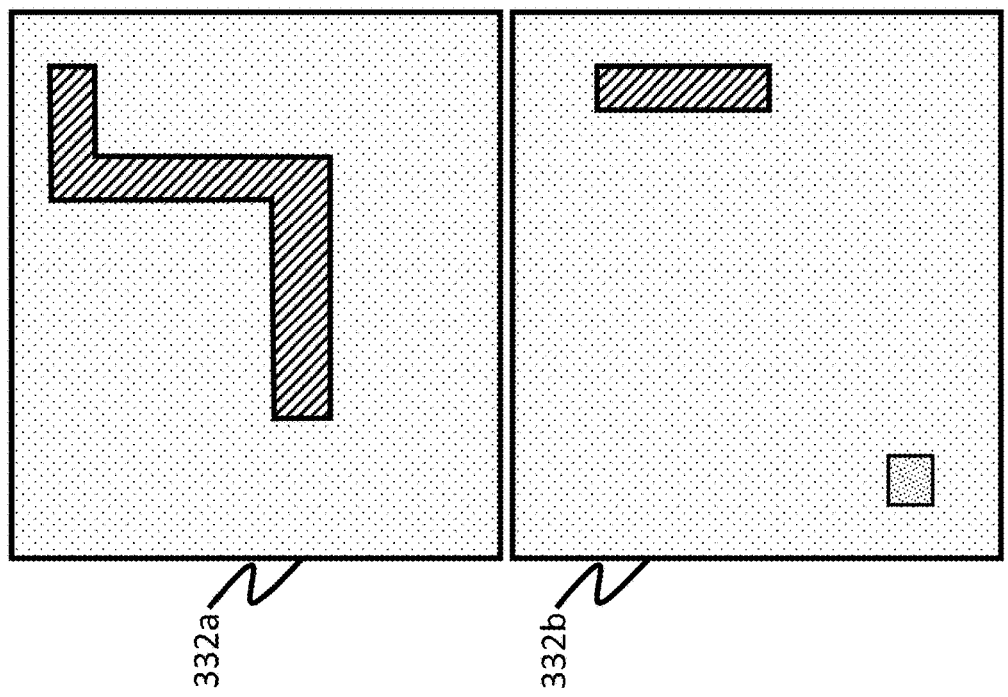
FIG. 31

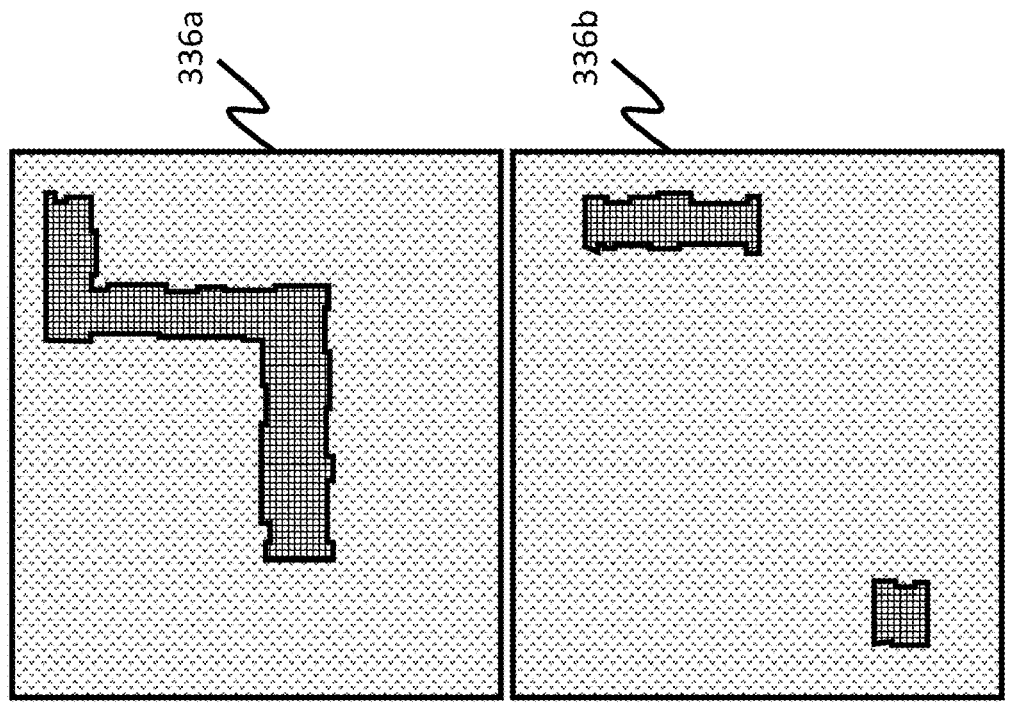
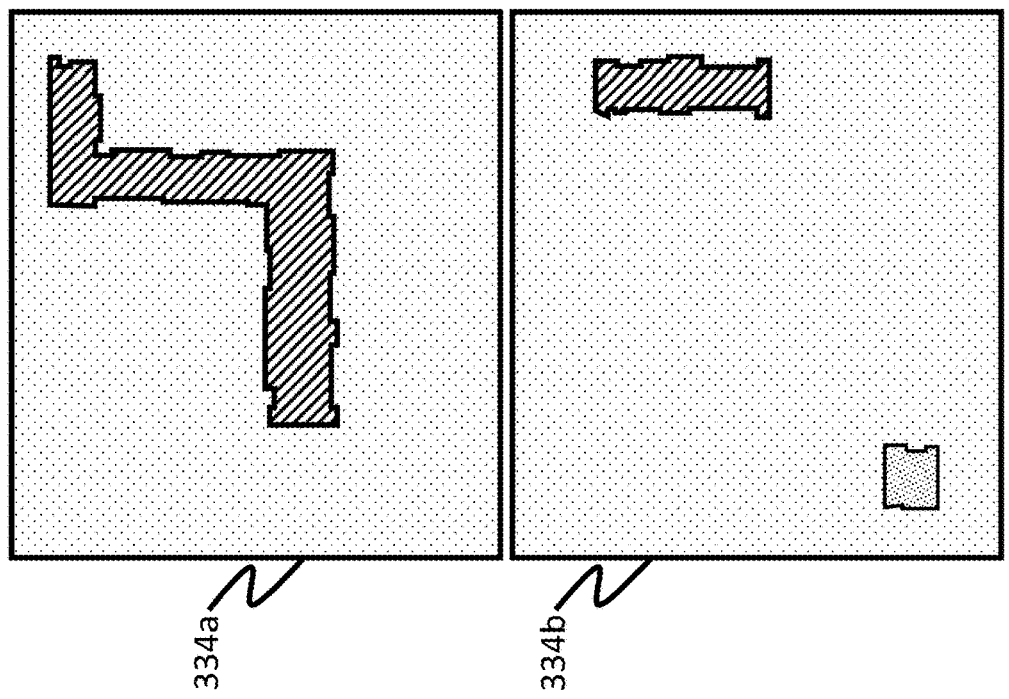
FIG. 3J

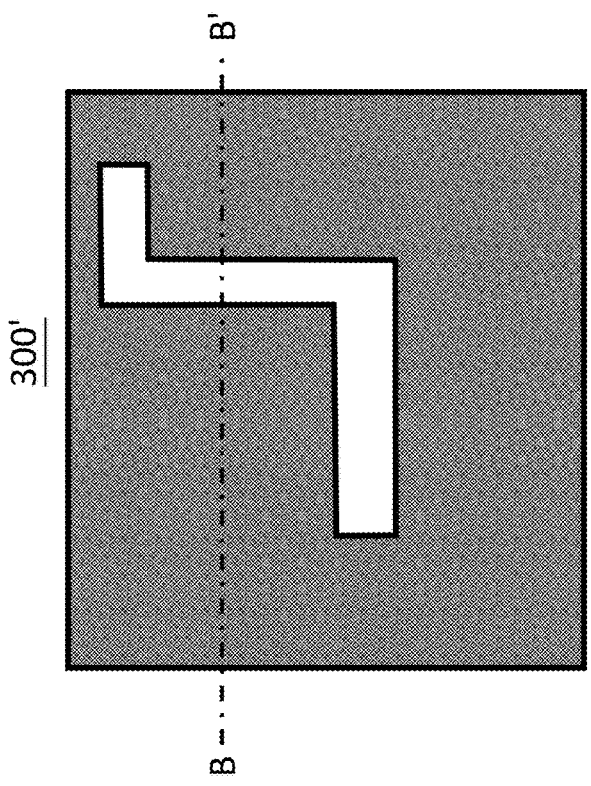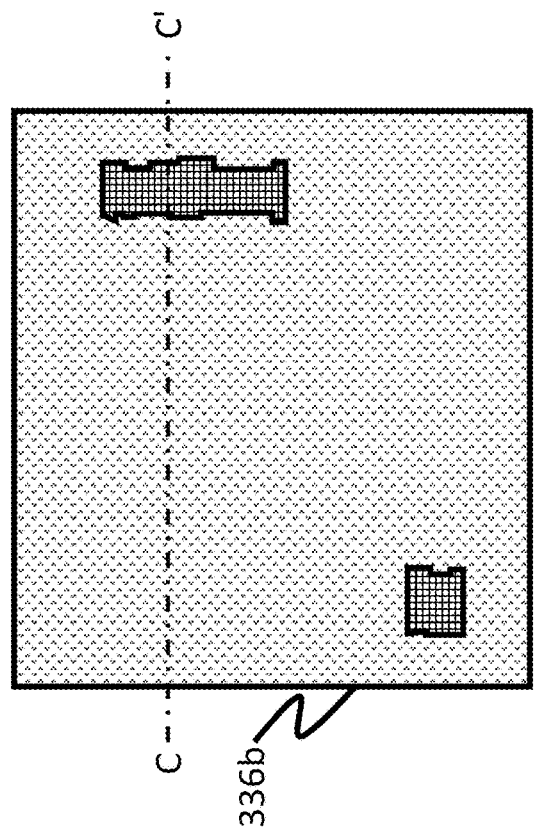
FIG. 3P

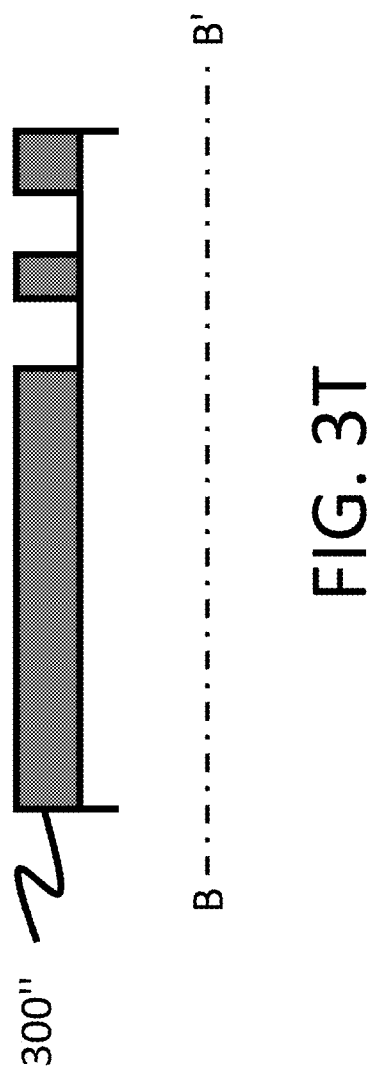

METHOD AND SYSTEM FOR GENERATING PHOTOMASK PATTERNS

PRIORITY CLAIM AND CROSS-REFERENCE

This application claims the benefit of provisional application Ser. 62/753,438 filed on Oct. 31, 2018, entitled "PHOTOMASK PATTERN GENERATING METHOD, DEVICE AND NON-TRANSITORY COMPUTER STORAGE READABLE MEDIUM THEREOF", the disclosure of which is hereby incorporated by reference in its entirety.

BACKGROUND

In conventional semiconductor manufacturing processes, photomasks are used during the manufacturing of the semiconductor device. Due to the complexity of photomask designs, hotspots occur and may damage the semiconductor device. Some hotspots which may damage the semiconductor device can be observed easily during the manufacturing of the photomask, while other potential hotspots which may damage the semiconductor device may not be easily observed during the manufacturing of the photomask.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 1B is a schematic view illustrating related image and mask patterns, in accordance with some embodiments of the present disclosure.

FIG. 1C is a schematic view of transferring photomask patterns to a semiconductor substrate, in accordance with some embodiments of the present disclosure.

FIG. 2B is a schematic view illustrating the format conversion between images, in accordance with some embodiments of the present disclosure.

FIG. 2F is a schematic view illustrating the generation of photomask patterns, in accordance with some embodiments of the present disclosure.

FIG. 3G is a schematic view illustrating the mapping of the hotspot objects to the original design layout image, in accordance with some embodiments of the present disclosure.

FIG. 3I is a schematic view illustrating the optical proximity correction of photomask patterns, in accordance with some embodiments of the present disclosure.

FIG. 3J is a schematic view of manufacturing photomasks by the photomask patterns, in accordance with some embodiments of the present disclosure.

FIGS. 3K to 3U are schematic views of transferring photomask patterns of the photomasks to a semiconductor substrate, in accordance with some embodiments of the present disclosure.

DETAILED DESCRIPTION

Figure 1A:
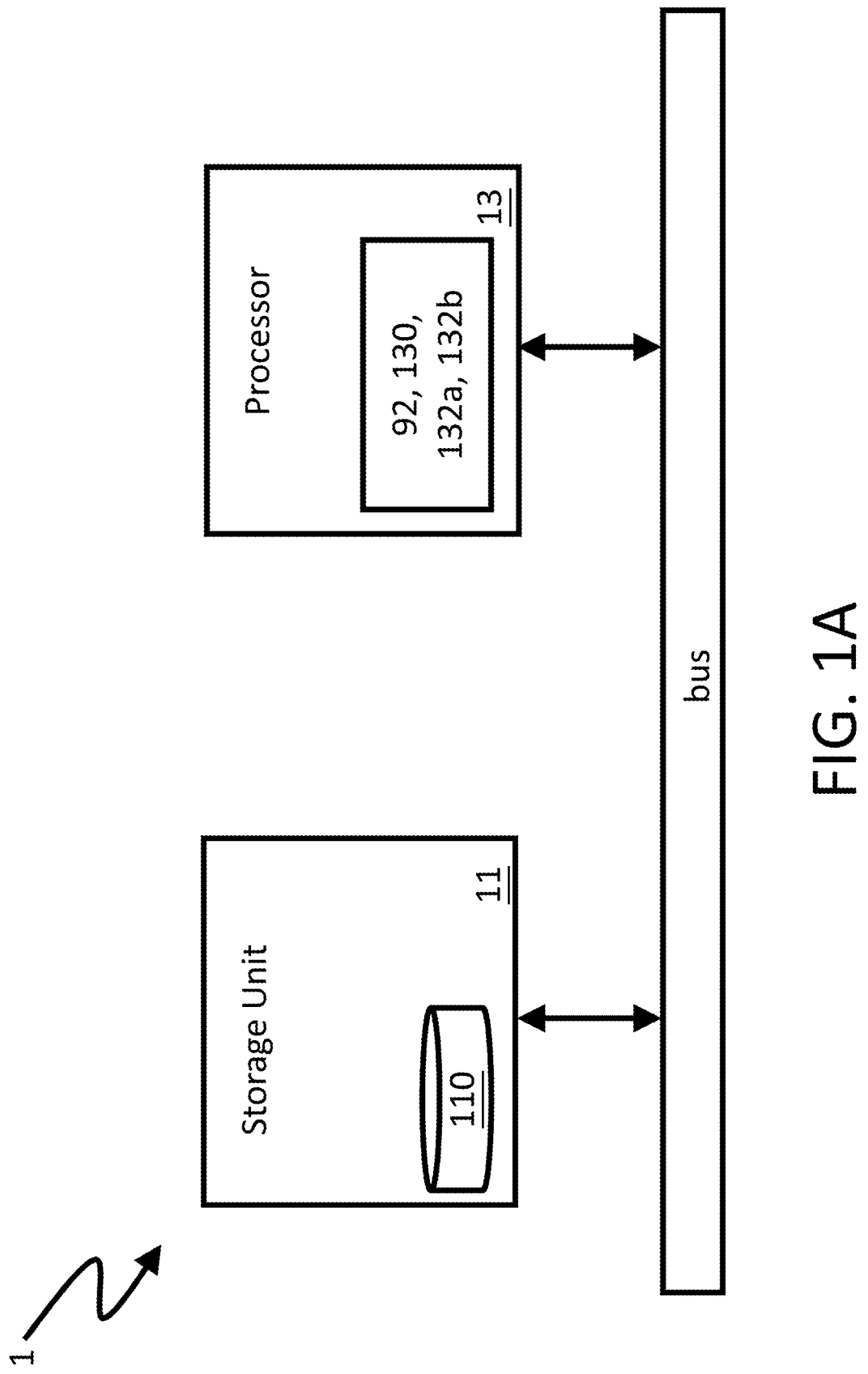
FIG. 1A is a block diagram of the system, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable inventive concepts that can be embodied in a wide variety of specific contexts. The specific embodiments discussed are merely illustrative and do not limit the scope of the disclosure.

Further, spatially relative terms, such as "beneath," "below," "lower," "above," "upper," "lower," "left," "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

FIGS. 1A to 1C illustrate some embodiments of the present disclosure. FIG. 1A is a block diagram of a system 1 for generating photomask patterns of some embodiments. FIG. 1B is a schematic view illustrating related image and photomask patterns of some embodiments. FIG. 1C is a schematic view of transferring photomask patterns to a semiconductor substrate of some embodiments. The system 1 includes a storage unit 11 and a processor 13. In the present embodiment, the storage unit 11 stores a hotspot detection model 110, which may include a trained model. The storage unit 11 and the processor 13 are electrically connected (e.g., electrically connected via bus), and the interactions therebetween are further described below.

As shown in FIGS. 1A to 1C, the processor 13 of the system 1 obtains a design layout image 92 of an integrated circuit (not shown). The processor 13 of the system 1 generates a hotspot image 130, which corresponds to the design layout image 92, by the hotspot detection model 110. In some embodiments, the processor 13 of the system 1 inputs the design layout image 92 into the hotspot detection model 110 for outputting the hotspot image 130. In some embodiments, the design layout image 92 and the hotspot image 130 may be composed of computer data which may be interpreted and displayed in human-readable image form via suitable software.

In some embodiments, the hotspot image 130 includes at least two adjacent hotspot objects 130A and 130B. The hotspot objects 130A and 130B may be determined, by the hotspot image model 110, to be adjacent to each other when a spacing SP1 between the hotspot object 130A and the hotspot object 130B is less than a threshold. In other words, a potential hotspot is detected between the hotspot object 130A and the hotspot object 130B, and a defect may occur at a location of a subsequently fabricated semiconductor substrate corresponding to the potential hotspot. Accordingly, for preventing the defect from occurring at the location corresponding to the potential hotspot, photomasks including the hotspot objects 130A and 130B may be transferred to the subsequently fabricated semiconductor substrate respectively.

In some embodiments, when the hotspot image 130 is outputted from the hotspot detection model 110, the adjacent hotspot objects 130A and 130B may be marked in the hotspot image 130 (e.g., marked by using a designated pixel value for the pixels of the hotspot objects 130A and 130B of the hotspot image 130). Accordingly, the processor 13 of the system 1 may process the hotspot image 130, and identify and mark the hotspot objects 130A and 130B in the hotspot image 130, and the processor 13 generates at least two photomask patterns 132a and 132b from the hotspot image 130 marked with the hotspot objects 130A and 130B. In particular, the at least two photomask patterns 132a and 132b include the objects 130A and 130B, respectively. Therefore, since the at least two hotspot objects 130A and 130B, between which a potential hotspot may occur, are separated into the at least two photomask patterns 132a and 132b, respectively, the defect corresponding to the potential hotspot may be prevented.

In other words, in some embodiments, the hotspot image 130 may be generated directly by the trained model such as the hotspot detection model 110, and the hotspot objects 130A and 130B of the hotspot image 130 may be separately marked in different photomask patterns 132a and 132b for proactively preventing defects in the subsequently fabricated semiconductor substrate. Specifically, when a location of a potential hotspot is detected between the hotspot objects 130A and 130B of the hotspot image 130, one of the hotspot objects 130A and 130B is formed in the photomask pattern 132a and another one of the hotspot objects 130A and 130B is formed in another photomask pattern 132b. With such configuration, the photomask patterns 132a and 132b, which include the hotspot objects 130A and 130B, may be respectively transferred to a semiconductor substrate 100 for preventing possible defects in the semiconductor substrate 100.

It should be noted that the mentioned trained model is trained based on a machine learning scheme with relevant training data. The details of the model training are described below (e.g., the embodiments of training models by the system 3). The hotspot detection model 110 that includes the trained model may be a machine learning model for receiving an image and detecting potential hotspots between the hotspot objects of the image.

Figure 2A:
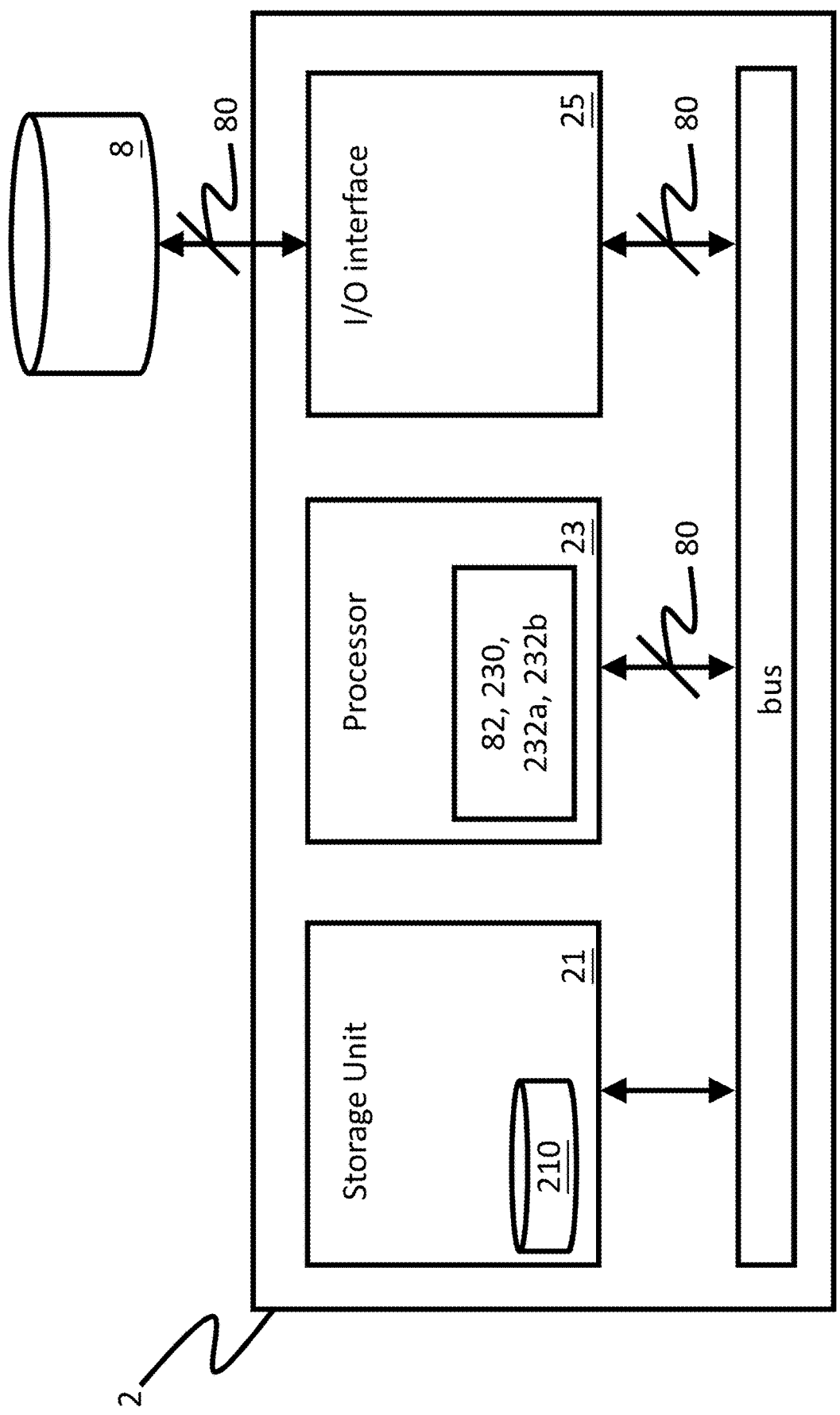
FIG. 2A is a block diagram of the system, in accordance with some embodiments of the present disclosure.

FIG. 2A illustrates some embodiments of the present disclosure. FIG. 2A is a block diagram of a system 2 of some embodiments. The system 2 includes a storage unit 21, a processor 23 and an input/output (I/O) interface 25. The storage unit 21 stores a hotspot detection model 210. The storage unit 21, the processor 23, and the I/O interface 25 are electrically connected (e.g., electrically connected via bus). It should be noted that, in some embodiments, the hotspot detection model 210 is a trained machine learning model. More details of generating photomask patterns are further described below.

Before making photomasks for manufacturing a semiconductor device, a corresponding design layout image is provided. In some embodiments, an original design layout image 80 of an integrated circuit is inputted from a design layout database 8 to the system 2 via the I/O interface 25. In other words, the I/O interface 25 of the system 2 retrieves the original design layout image 80 from the design layout database 8.

FIG. 2B shows schematic views illustrating the format conversion between images of some embodiments. After the I/O interface 25 retrieves the original design layout image 80, the processor 23 of the system 2 converts the original design layout image 80 in a first format (e.g., binary file format) into a design layout image 82 in a second format (e.g., bitmap format). In some embodiments, the original design layout image 80 is in binary file format, and can be interpreted and displayed as a human-readable image via suitable software. The design layout image 82 is in bitmap format, and can be interpreted and displayed as a human-readable image via suitable software. However, it is not intended to limit the image format of the embodiments of the present disclosure.

Figure 2C:
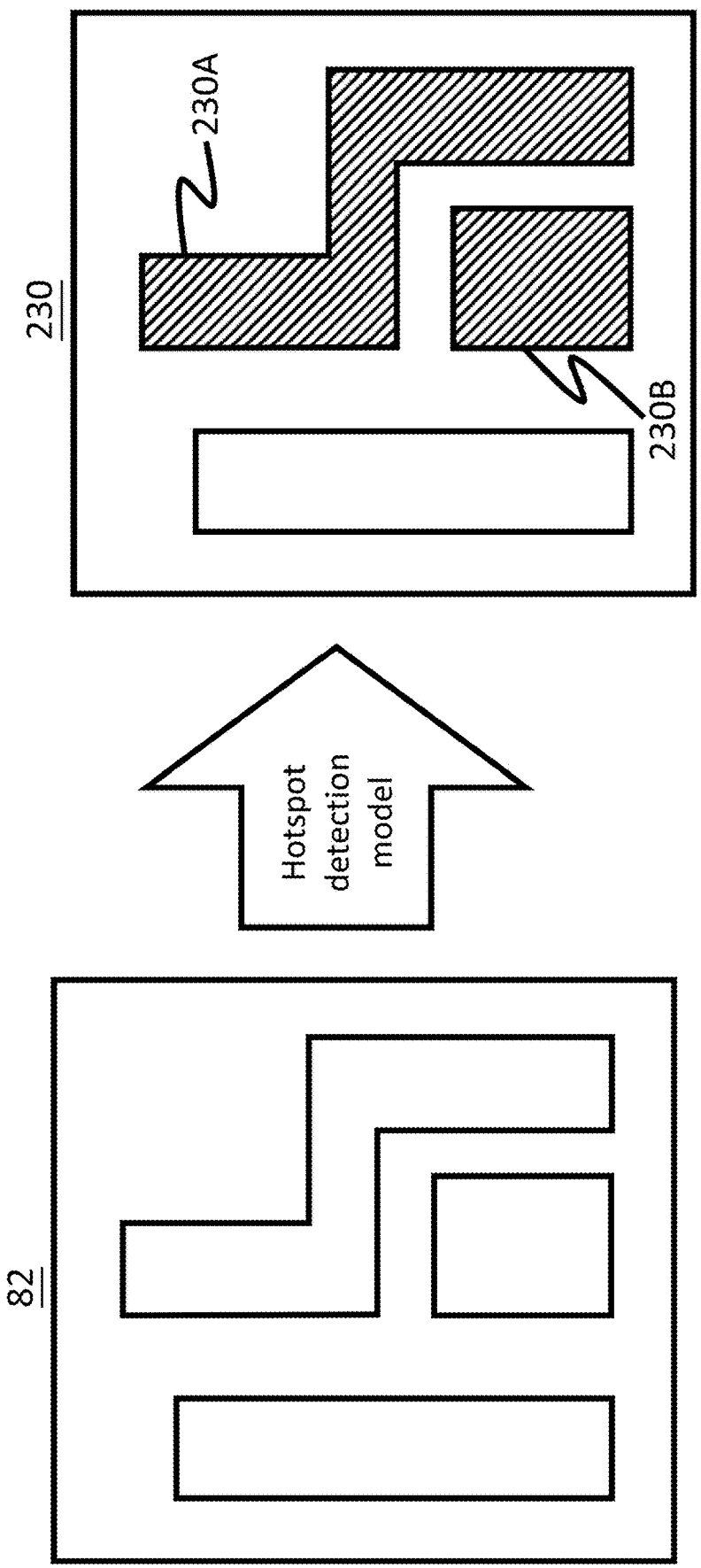
FIG. 2C is schematic view illustrating the conversion between images, in accordance with some embodiments of the present disclosure.

FIG. 2C shows schematic views illustrating the conversion between images of some embodiments. The processor 23 of the system 2 converts the design layout image 82 into a hotspot image 230 by the hotspot detection model 210. In particular, the processor 23 of the system 2 inputs the design layout image 82 into the hotspot detection model 210 for outputting the hotspot image 230. In other words, the processor 23 of the system 2 applies the hotspot detection model 210 to the design layout image 82 to generate the hotspot image 230.

Specifically, because the hotspot detection model 210 is a trained machine learning model, there should be given input data and subsequent output data. In some embodiments, the design layout image 82 is given as the input data for the hotspot detection model 210, and the subsequent output data is the hotspot image 230. Further, the hotspot image 230 outputted from the hotspot detection model 210 is in the second format (e.g., bitmap format), and is marked with at least two hotspot objects 230A and 230B. In some embodiments, the hotspot image 230 is in the second format (e.g., bitmap format), and the at least two hotspot objects 230A and 230B may be marked by designated pixel value for the pixels of the hotspot objects 230A and 230B of the hotspot image 230.

Figure 2D:
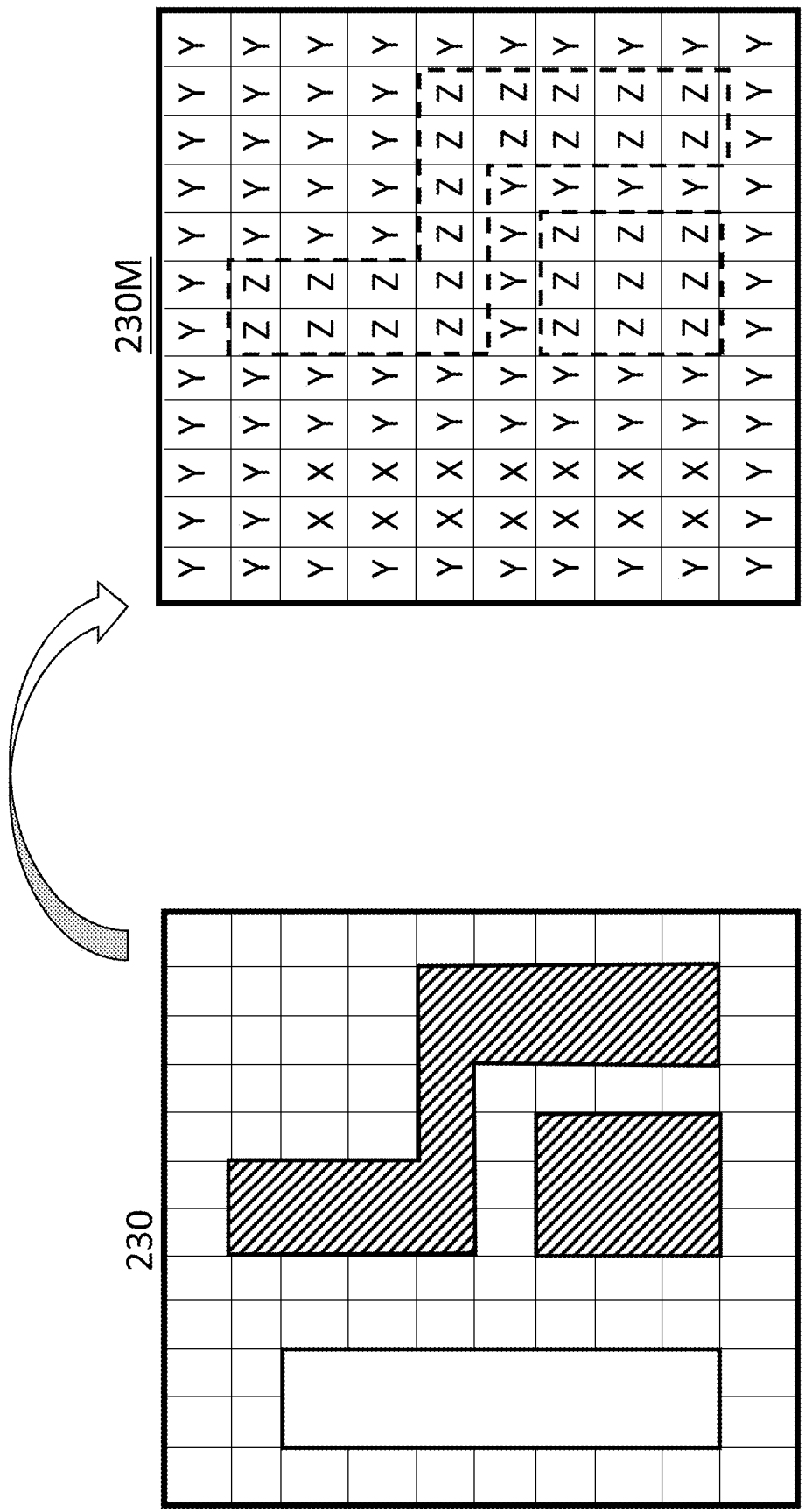
FIG. 2D is a schematic view illustrating the hotspot image with the hotspot objects in bitmap format, in accordance with some embodiments of the present disclosure.

FIG. 2D is a schematic view illustrating the hotspot image 230 in bitmap format according to some embodiments. In detail, because the hotspot image 230 is in the second format (e.g., bitmap format), there may be an image bitmap 230M corresponding to the hotspot image 230, and each element with a value in the image bitmap 230M represents a corresponding pixel of the hotspot image 230.

Moreover, in some embodiments, when the value of an element of the image bitmap 230M is X, the corresponding pixel of the hotspot image 230 represents a normal object, which is not an object of a potential hotspot. When the value of an element of the image bitmap 230M is Y, the corresponding pixel of the hotspot image 230 represents background. When the value of an element of the image bitmap 230M is Z, the corresponding pixel of the hotspot image 230 is marked as a hotspot object, which is an object of a potential hotspot.

Figure 2E:
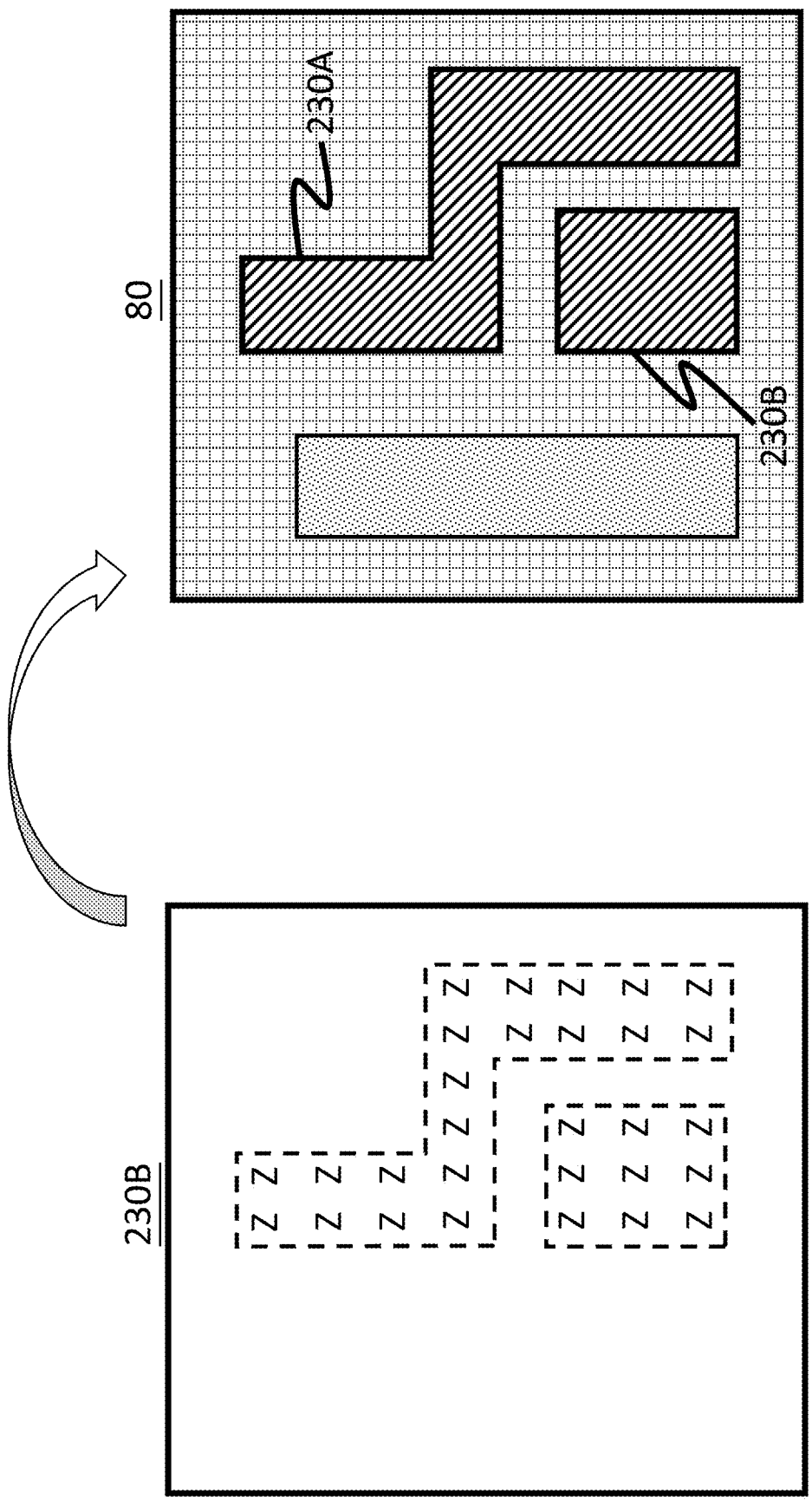
FIG. 2E is a schematic view illustrating the mapping of the hotspot objects to the original design layout image, in accordance with some embodiments of the present disclosure.

FIG. 2E is a schematic view illustrating the mapping of the at least two hotspot objects 230A and 230B to the original design layout image 80 of some embodiments. Since the image bitmap 230M is a bitmap which contains position information of pixels of an image (e.g., coordinates of pixels of an image), the position information of the pixels of the hotspot objects 230A and 230B may be determined accordingly. Next, the processor 23 of the system 2 determines the at least two hotspot objects 230A and 230B in the original design layout image 80 according to the position information.

Figure 2G:
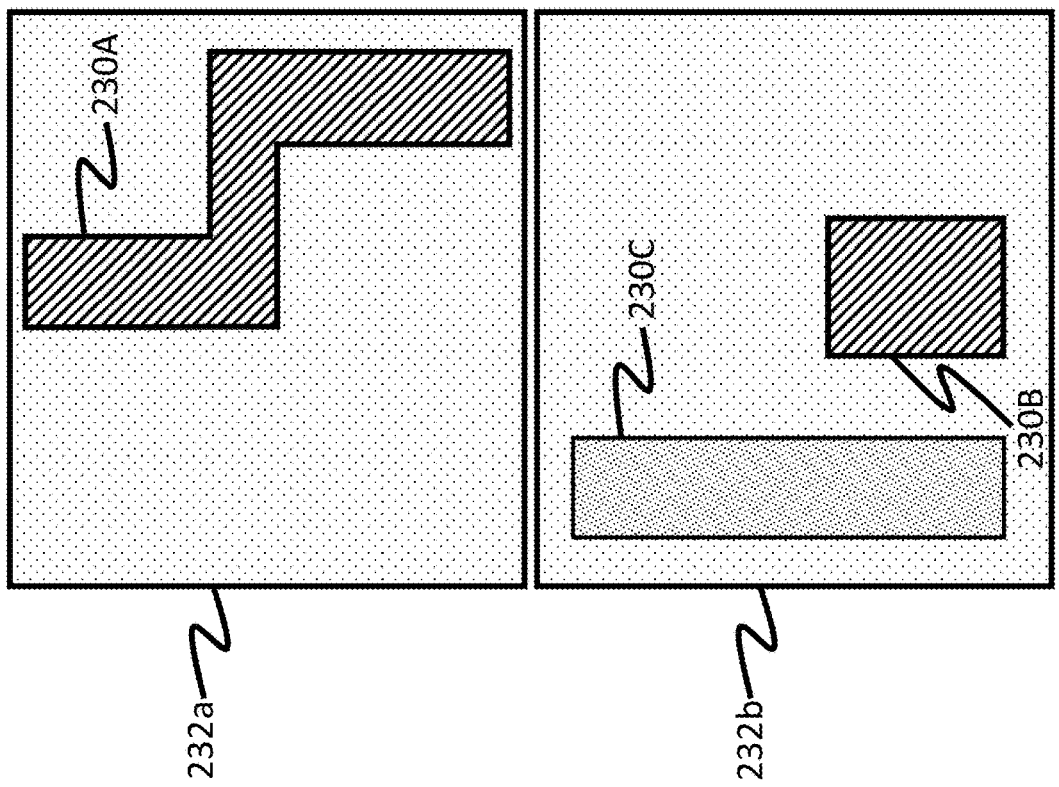
FIG. 2G is a schematic view of transferring photomask patterns to the semiconductor substrate, in accordance with some embodiments of the present disclosure.

FIG. 2F is a schematic view illustrating the generation of two photomask patterns of some embodiments. After determining the at least two hotspot objects 230A and 230B in the original design layout image 80, the processor 23 of the system 2 generates two photomask patterns 232a and 232b for the original design layout image 80. Specifically, one of the hotspot objects 230A and 230B is formed in the photomask pattern 232a and another of the hotspot objects 230A and 230B is formed in another photomask pattern 232b. In some embodiments, a normal object which is irrelevant to the potential hotspot may be formed in either the photomask pattern 232a or the photomask pattern 232b. As shown in FIG. 2F, a normal object 230C is formed in the photomask patterns 232b. As shown in FIG. 2G, with such configuration, the photomask patterns 232a and 232b, which include the hotspot objects 230A, 230B and 230C, may be respectively transferred to a semiconductor substrate 200 to prevent possible defects in the semiconductor substrate 200.

In some embodiments, transferring the at least two photomask patterns 232a and 232b to the semiconductor substrate 200 may be implemented by the operations of: forming a photo resist layer over the semiconductor substrate 200; and exposing the photo resist layer to actinic radiation through at least two photomasks which have the at least two photomask patterns 232a and 232b, respectively.

It should be noted that, the mentioned trained model is trained based on a machine learning scheme with relevant training data. The details of the model training are described below (e.g., the embodiments of training models by the system 3). The hotspot detection model 210 that includes the trained model may be a machine learning model for receiving an image and detecting a potential hotspot between the hotspot objects of the image.

Figure 3A:
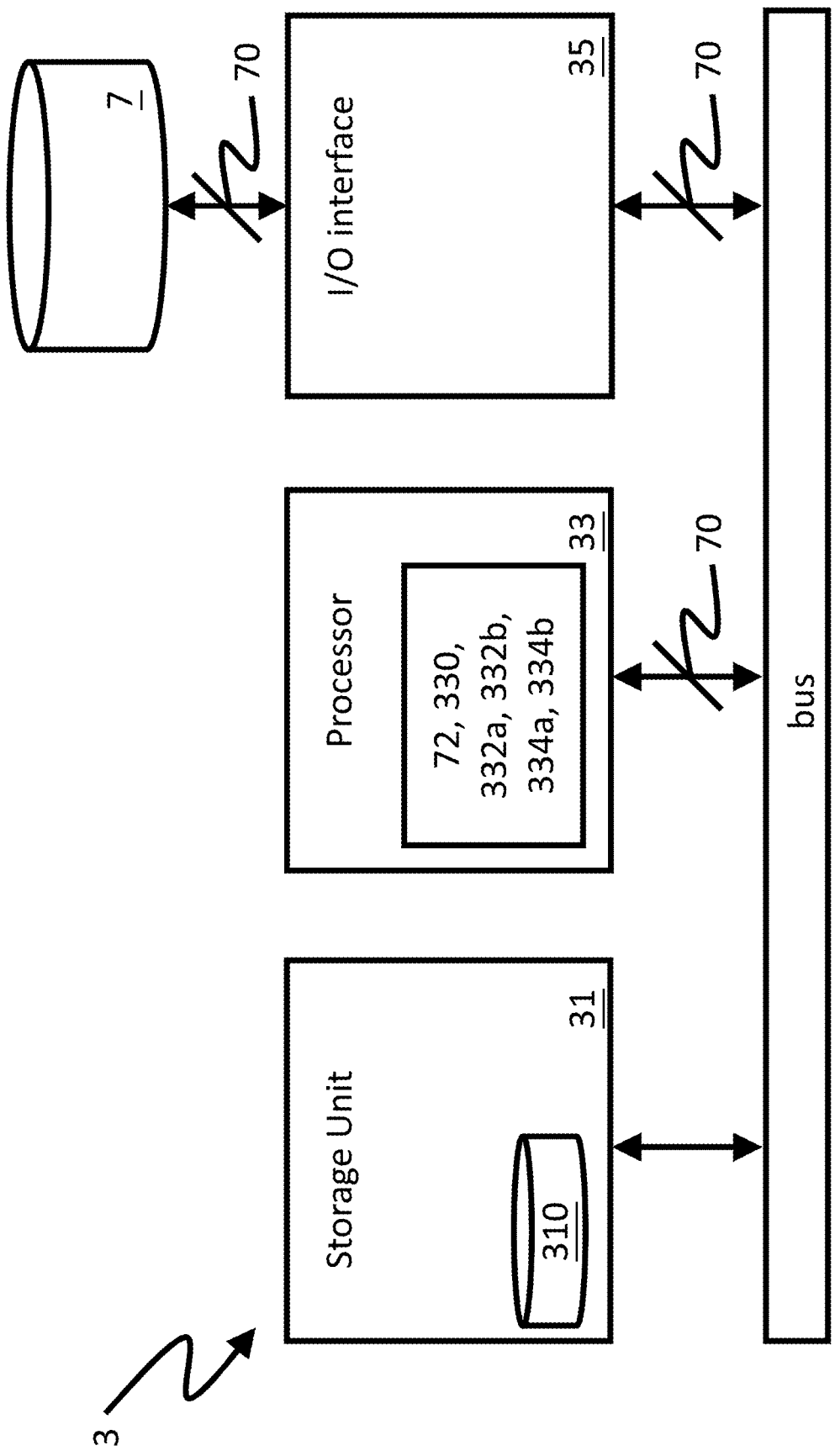
FIG. 3A is a block diagram of the system, in accordance with some embodiments of the present disclosure.

FIG. 3A illustrates some embodiments of the present disclosure. FIG. 3A is a block diagram of a system 3 of some embodiments. The system 3 includes a storage unit 31, a processor 33 and an I/O interface 35. The storage unit 31 stores a hotspot detection model 310. The storage unit 31, the processor 33, and the I/O interface 35 are electrically connected (e.g., electrically connected via bus). It should be noted that, in some embodiments, the hotspot detection model 310 is a trained machine learning model. The process of generating photomask patterns are further described hereinafter.

Figure 3B:
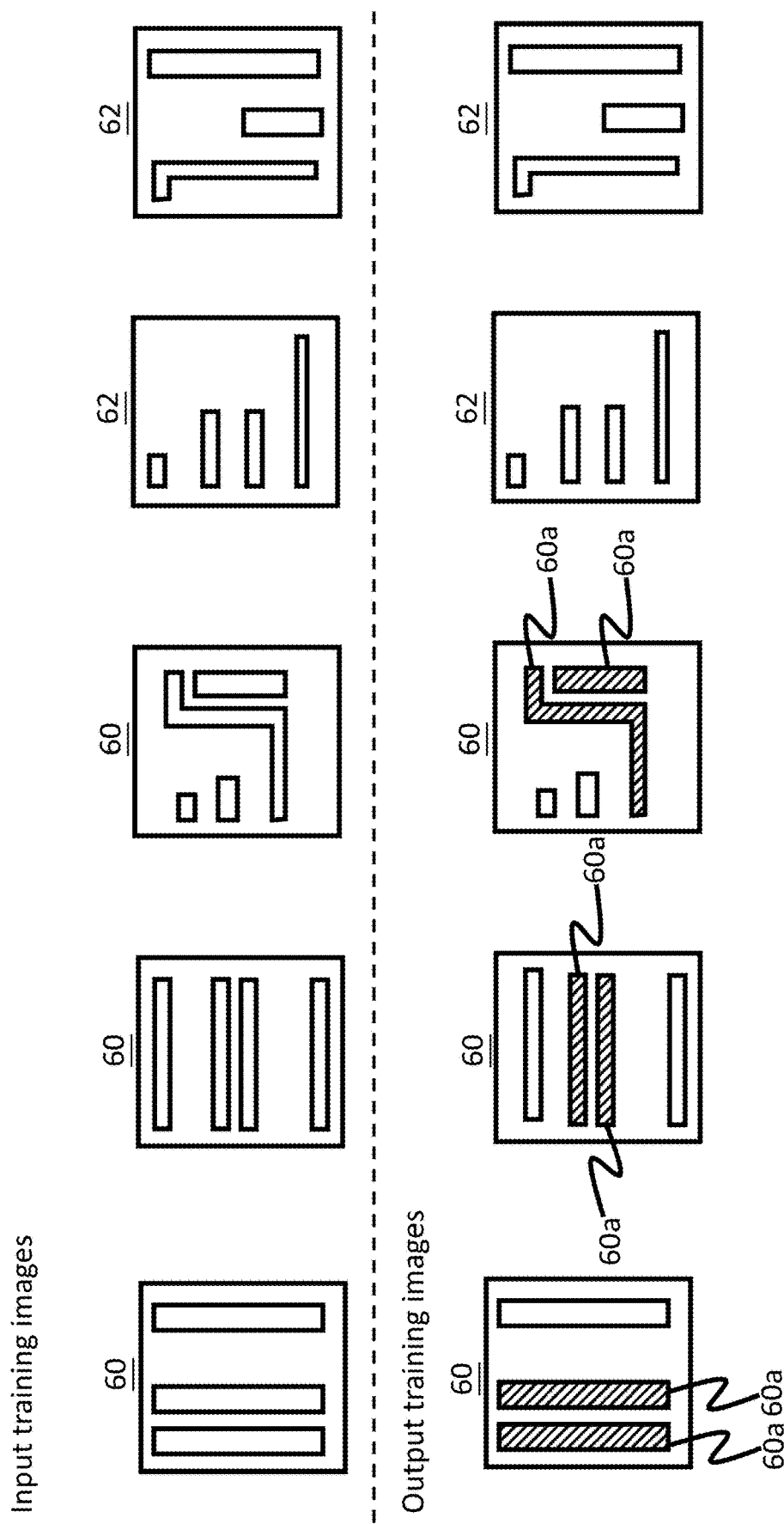
FIG. 3B is a schematic view illustrating images related to establishing a hotspot detection model, in accordance with some embodiments of the present disclosure.

FIG. 3B is a schematic view illustrating images for establishing hotspot detection model of some embodiments. Before being applied, the machine learning model of the disclosure may be trained first. In some embodiments, the hotspot detection model is used for converting a design layout image in bitmap format into a hotspot image with hotspot objects labeled in bitmap format.

In detail, the processor 33 establishes the hotspot detection model 310 by at least one first image 60, the at least one first image 60 labeled with hotspot objects 60a, at least one second image 62, and the at least one second image 62 without labelling of hotspot object. The at least one first image 60 and the at least one second image 62 are used as input data during a training stage, and the at least one first image 60 labeled with hotspot objects 60a and the at least one second image 62 without labelling of hotspot objects are used as output data at training stage.

It should be noted that, in some embodiments, the at least one first image 60 used as training input images for training the hotspot detection model 310 may be bitmap images converted from binary layout images. The at least one first image 60 labeled with hotspot object 60a and used as training output images for training the hotspot detection model 310 may be the bitmap images with hotspot object 60a, and a potential hotspot can be identified from the at least one first image 60 labeled with hotspot object 60a.

Similarly, in some embodiments, the at least one second image 62 used as training input images for training the hotspot detection model 310 may be bitmap images converted from binary layout images. The at least one second image 62 without labelling of hotspot object is used as training output images for training the hotspot detection model 310 and may be the bitmap images without hotspot object, and absence of potential hotspot can be determined from the at least one second image 62 without labelling of hotspot object. After the processor 35 establishes the hotspot detection model 310, the storage unit 31 stores the hotspot detection model 310 for later use.

In some embodiments, the hotspot detection model 310 can be trained with images according to an algorithm that is capable of obtaining segmentation information of images. In other words, the algorithm is capable of classifying different features into different segmentations of the images. In some embodiments, Fully Convolutional Networks (FCN) for Semantic Segmentation may be used as the algorithm. Furthermore, in the embodiment of an algorithm according to FCN for Semantic Segmentation, there is a training function for training the hotspot detection model 310. During of the training of the hotspot detection model 310, the training function includes a section for receiving two sets of images. One of the sets of images includes the first images 60 and the second image 62 which are used as input training data. Another set of images includes the first images 60 labeled with hotspot objects 60a and the second image 62 without labelling of hotspot object, which are used as output training data. Accordingly, the hotspot detection model 310 can be trained after the training function is executed with a main program of the algorithm according to FCN for Semantic Segmentation.

Before making photomasks for manufacturing a semiconductor device, a corresponding design layout image is provided. In some embodiments, an original design layout image 70 of an integrated circuit is inputted from a design layout database 7 to the system 3 via the I/O interface 35. In other words, the I/O interface 35 of the system 3 retrieves the original design layout image 70 from the design layout database 7.

Figure 3C:
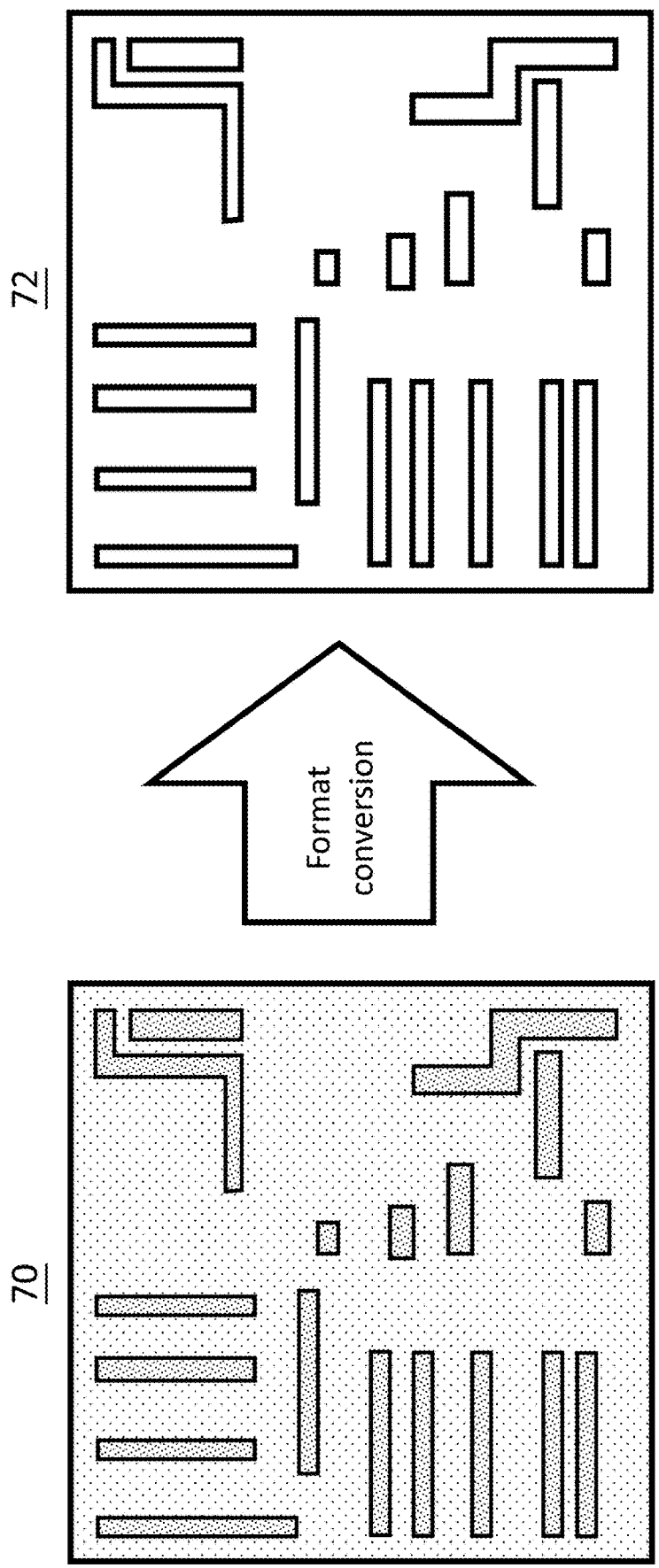
FIGS. 3C to 3E are schematic views illustrating the conversion and process between images, in accordance with some embodiments of the present disclosure.
Figure 3D:
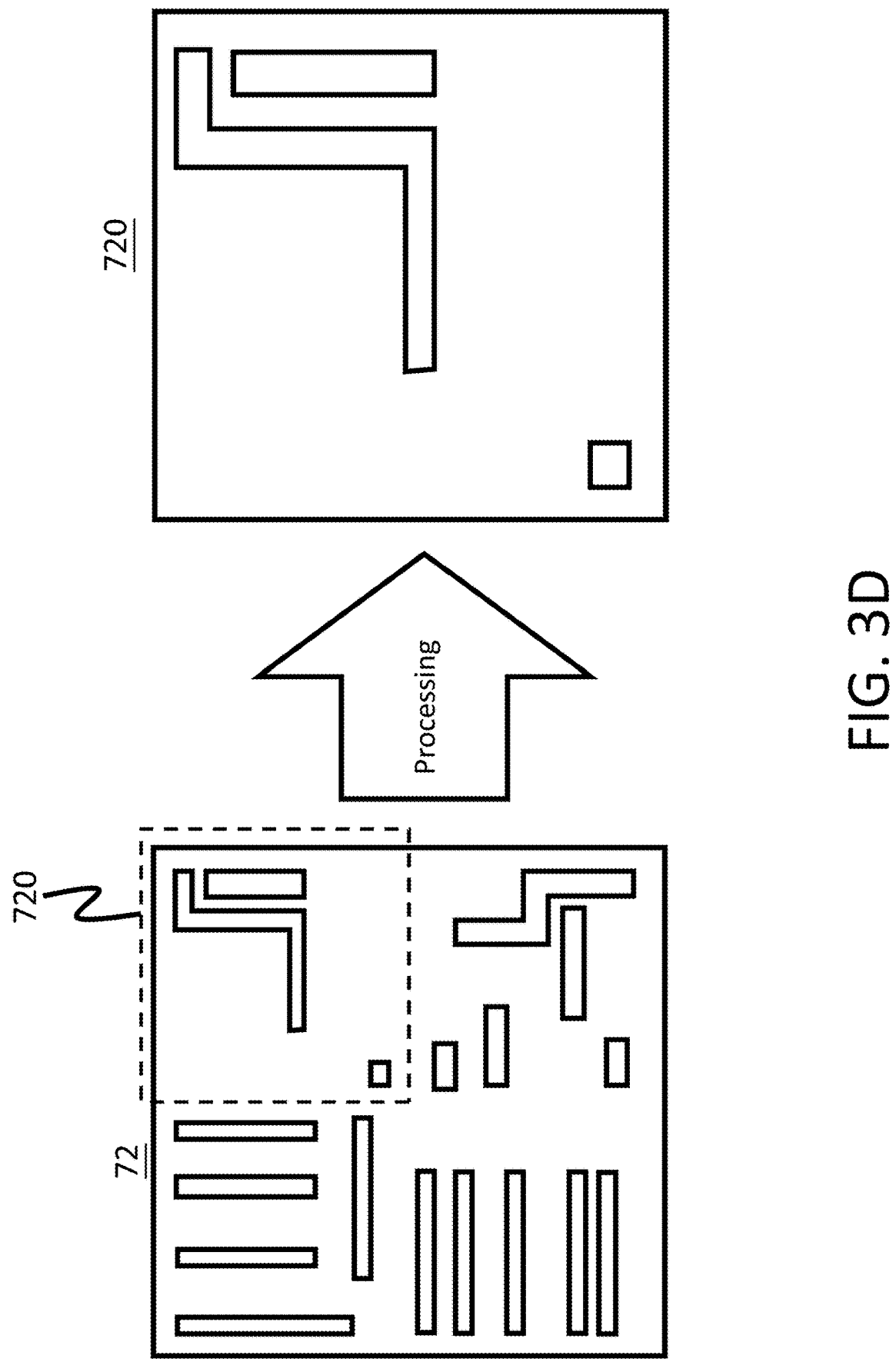
Figure 3E:
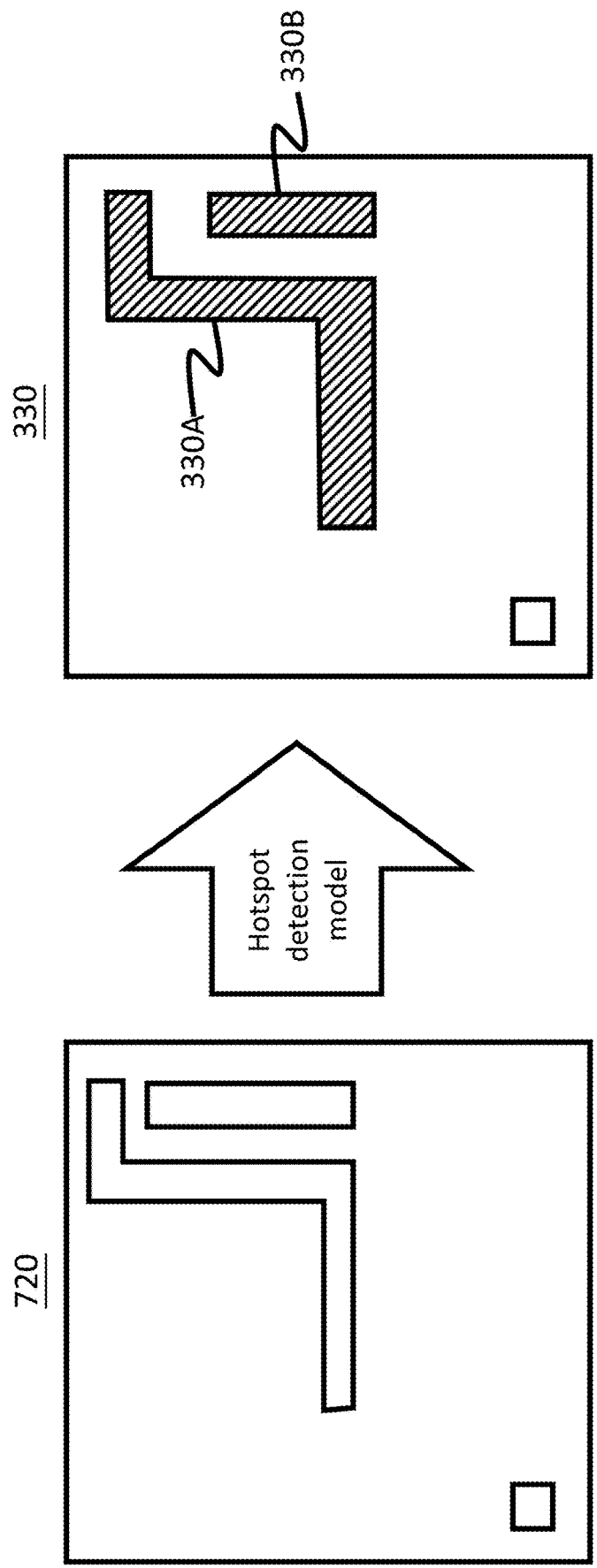

FIGS. 3C to 3E are schematic views illustrating the conversion between and processing of images according to some embodiments. The original design layout image 70 is in a first format (e.g., binary file format), and the processor 33 of the system 3 converts the original design layout image 70 in the first format into a design layout image 72 in a second format (e.g., bitmap format).

In some embodiments, the design layout image 72 is processed before being used. In detail, the processor 33 of the system 3 processes the design layout image 72 for deriving a clip image 720. In other words, the clip image 720 is part of the design layout image 72. Subsequently, the processor 33 of the system 3 converts the clip image 720 into a hotspot image 330 by the hotspot detection model 310. In some embodiments, the clip image 720 may be the whole design layout image 72. In some embodiments, the clip image 720 may be part of the design layout image 72 according to a user-defined window size. For example, when a user-defined window size is 200 μm*200 μm, the clip image 720 is a 200 μm*200 μm image. In some embodiments, the user-defined window size may depend on the size of the whole design layout image 72.

It should be noted that, because the hotspot detection model 310 is a trained machine learning model, there should be input data provided and subsequent output data. In some embodiments, the clip image 720 is given as the input data for the hotspot detection model 310, and the subsequent output data is the hotspot image 330. Further, the hotspot image 330 outputted from the hotspot detection model 310 is in the second format (e.g., bitmap format), and is marked with at least two hotspot objects 330A and 330B. In some embodiments, the hotspot image 330 is in the second format (bitmap format for example), and the at least two hotspot objects 330A and 330B may be marked by designated pixel values for the pixels of the hotspot objects 330A and 330B.

Figure 3F:
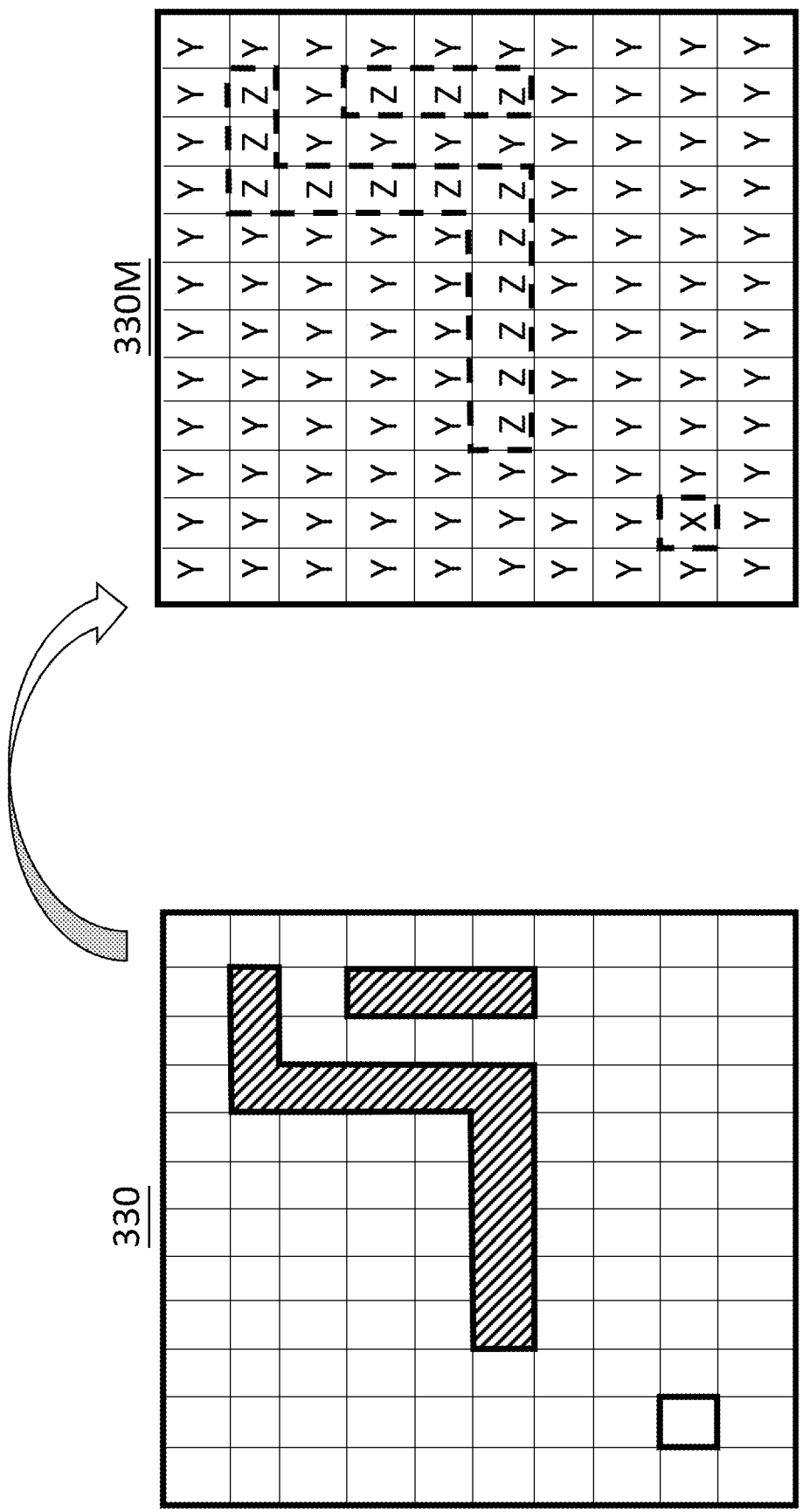
FIG. 3F is a schematic view illustrating the hotspot image with the hotspot objects in bitmap format, in accordance with some embodiments of the present disclosure.

FIG. 3F is a schematic view illustrating the hotspot image 330 in bitmap format according to some embodiments. In detail, because the hotspot image 330 is in the second format (e.g., bitmap format), there may be an image bitmap 330M corresponding to the hotspot image 330, and each element with a value in the image bitmap 330M represents a corresponding pixel of the hotspot image 330.

Similarly, in some embodiments, when the value of an element of the image bitmap 330M is X, the corresponding pixel of the hotspot image 330 represents a normal object, which is not an object of a potential hotspot. When the value of an element of the image bitmap 330M is Y, the corresponding pixel of the hotspot image 330 represents background. When the value of an element of the image bitmap 330M is Z, the corresponding pixel of the hotspot image 330 is marked as a hotspot object, which is an object of a potential hotspot.

FIG. 3G is a schematic view illustrating the mapping of the at least two hotspot objects 330A and 330B to the original design layout image 70 of some embodiments. Since the image bitmap 330M is a bitmap which includes with position information of pixels of an image (e.g., coordinates of pixels of an image), the position information of the pixels of the hotspot objects 330A and 330B may be determined accordingly. Next, the processor 3 of the system 3 determines the at least two hotspot objects 330A and 330B in the original design layout image 70 according to the position information. It should be noted that, in FIG. 3G, image 70' illustrates the clip image 720 of the original design layout image 70.

Figure 3H:
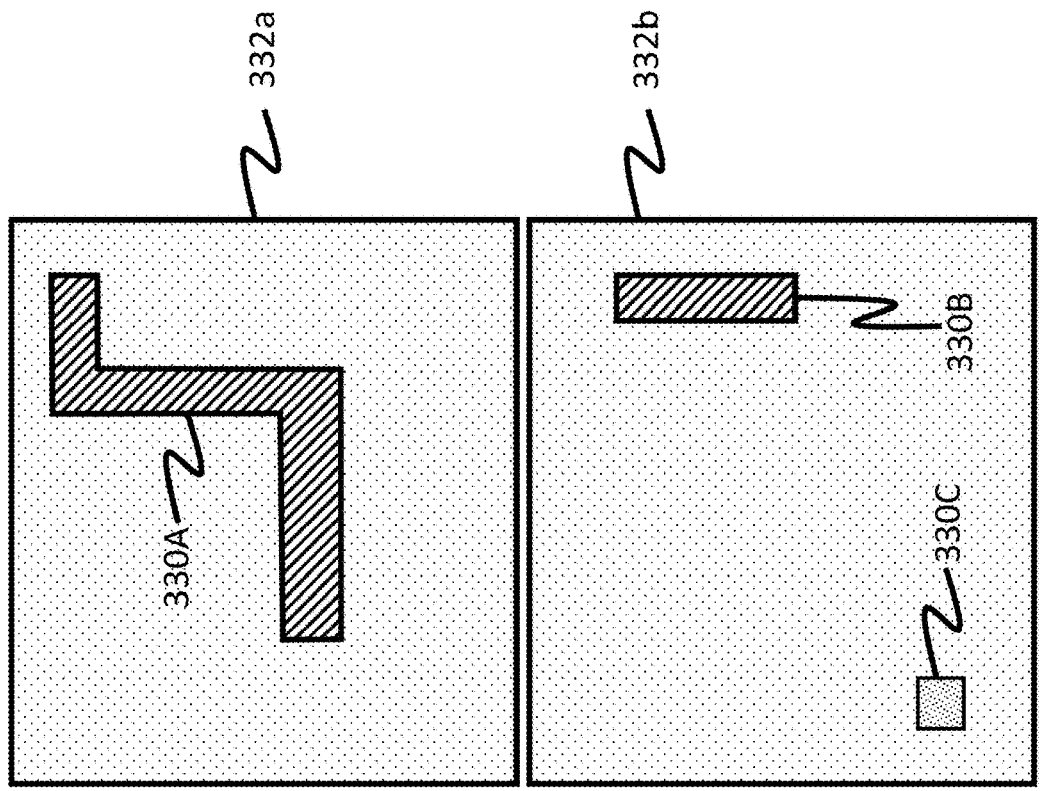
FIG. 3H is a schematic view illustrating the generation of photomask patterns, in accordance with some embodiments of the present disclosure.

FIG. 3H is a schematic view illustrating the generation of two photomask patterns of some embodiments. After determining the at least two hotspot objects 330A and 330B in image 70', the processor 33 of the system 3 generates two photomask patterns 332a and 332b for the original design layout image 70. The photomask pattern 332a includes the hotspot object 330A and another photomask pattern 332b includes the hotspot object 330B. Specifically, one of the hotspot objects 330A and 330B is formed in the photomask pattern 332a and another of the hotspot objects 330A and 330B is formed in another photomask pattern 332b. In some embodiments, a normal object which is irrelevant to the potential hotspot may be formed in either the photomask patterns 332a or 332b. As shown in FIG. 3H, a normal object 330C is formed in the photomask patterns 332b.

FIG. 3I is a schematic view illustrating the optical proximity correction of two photomask patterns according to some embodiments. In some embodiments, the processor 33 of the system 3 applies an optical proximity correction, which is a photolithography enhancement technique used to compensate for image errors due to diffraction or process effects, to the two photomask patterns 332a and 332b for deriving at least two corrected photomask patterns 334a and 334b. As shown in FIG. 3J, the corrected photomask patterns 334a and 334b, which include the hotspot objects 330A, 330B and 330C, may be used for manufacturing at least two photomasks 336a and 336b. In detail, the I/O interface 35 of the system 3 may provide the corrected photomask patterns 334a and 334b to a photomask manufacturing machine for generating the at least two photomasks 336a and 336b.

With such configuration, the photomasks 336a and 336b, which include the corrected photomask patterns 334a and 334b, may be respectively used to transfer the corrected photomask patterns 334a and 334b to a semiconductor substrate 300 to prevent possible defects in the semiconductor substrate 300.

Figure 3K:
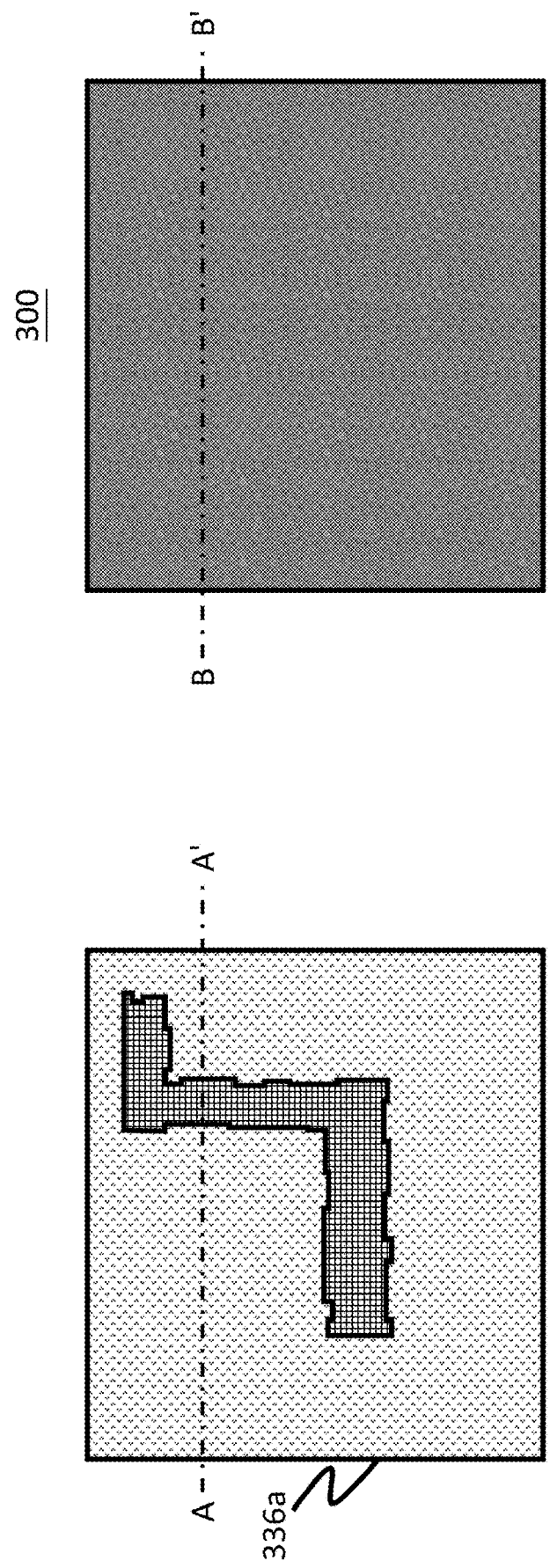
Figure 3L:
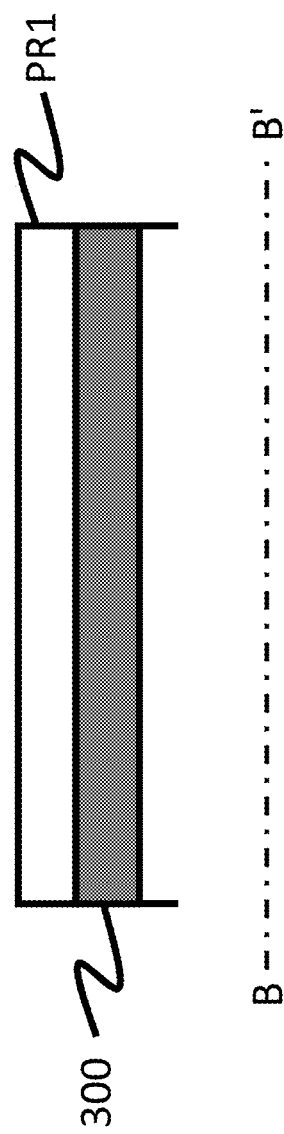
Figure 3M:
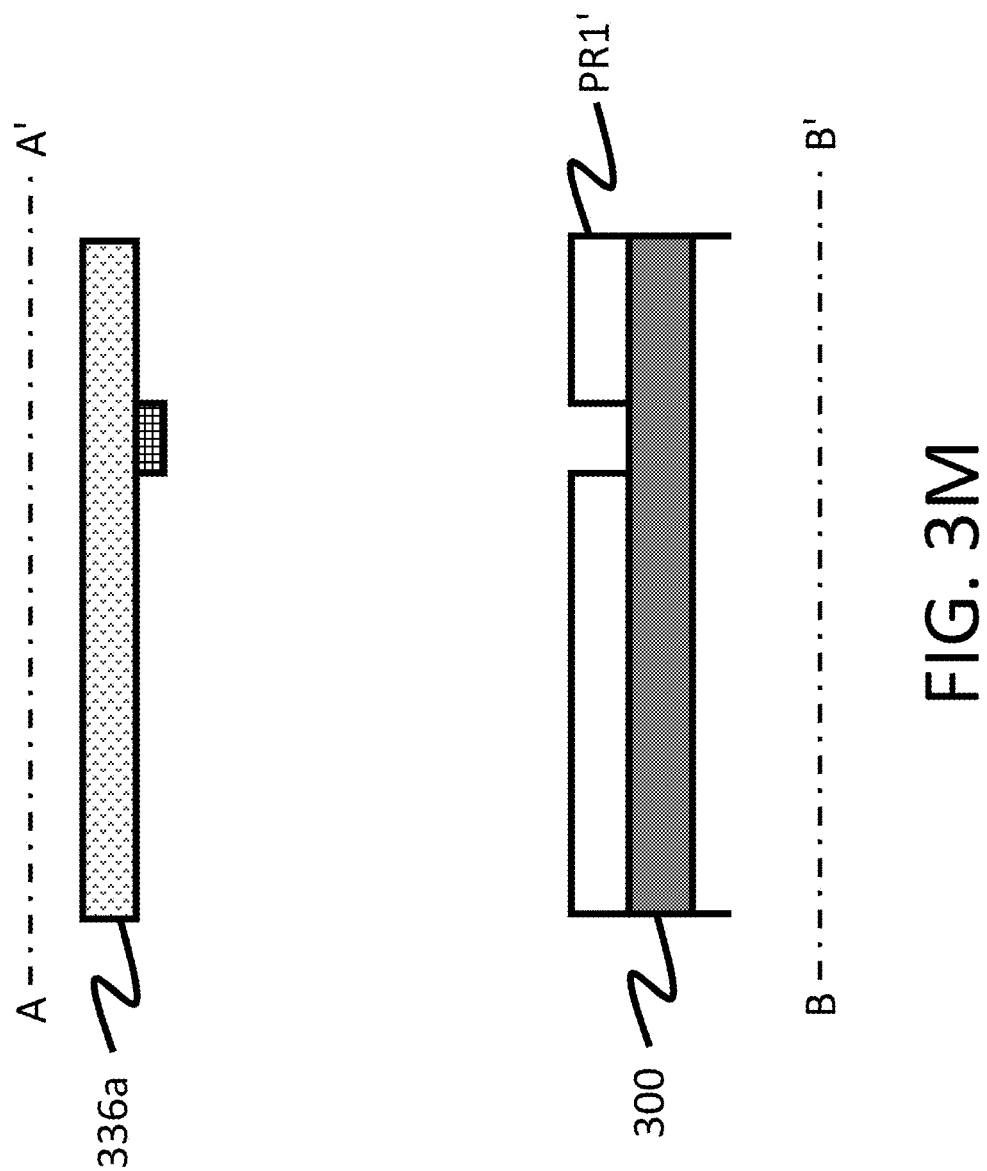

FIGS. 3K to 3U illustrate operation of transferring the at least two photomask patterns 334a and 334b to the semiconductor substrate 300. FIGS. 3L to 3O illustrate the photomask 336a as shown in FIG. 3K is applied. As shown in FIG. 3L, a first photo resist layer PR1 is formed over the semiconductor substrate 300. In some embodiments as shown in FIG. 3M, the first photo resist layer PR1 is irradiated by actinic radiation such as ultraviolet (UV) through the photomask 336a. In some embodiments, a portion of the first photo resist layer PR1 exposed to the actinic radiation is removed. Therefore, a first patterned photo resist layer PRP is formed.

Figure 3N:
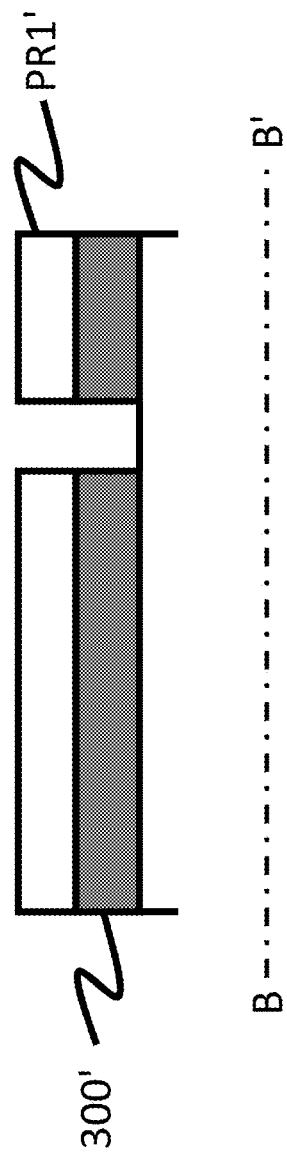
Figure 30:
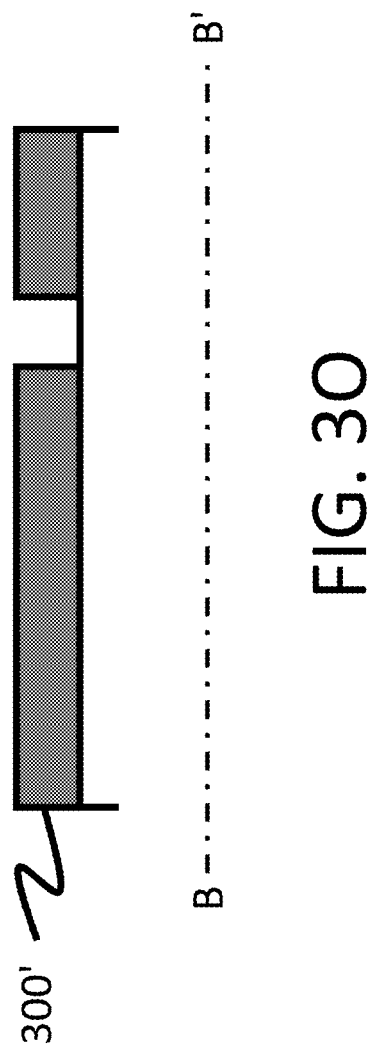

As shown in FIGS. 3N to 3O, the first patterned photo resist layer PRP is used as a mask for forming a first patterned semiconductor substrate 300'. In some embodiments as shown in FIG. 3N, a portion of the semiconductor substrate 300 exposed from the first patterned photo resist layer PR1' is removed to form the first patterned semiconductor substrate 300'. In some embodiments as shown in FIG. 3O, the first patterned photo resist layer PRP is removed after the formation of the first patterned semiconductor substrate 300'.

Figure 3Q:
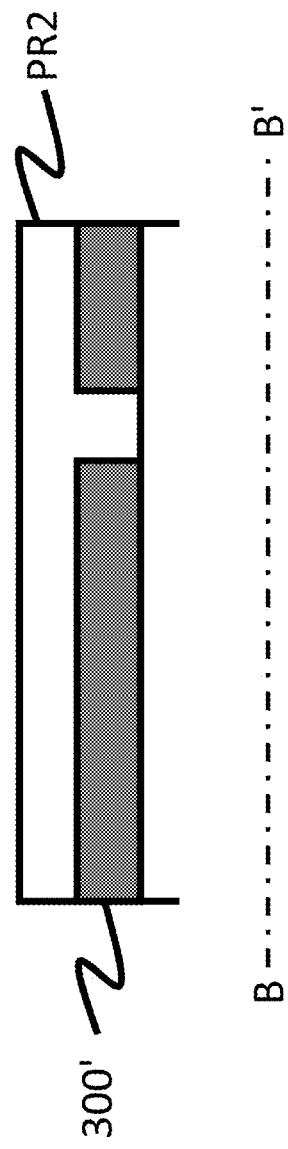
Figure 3R:
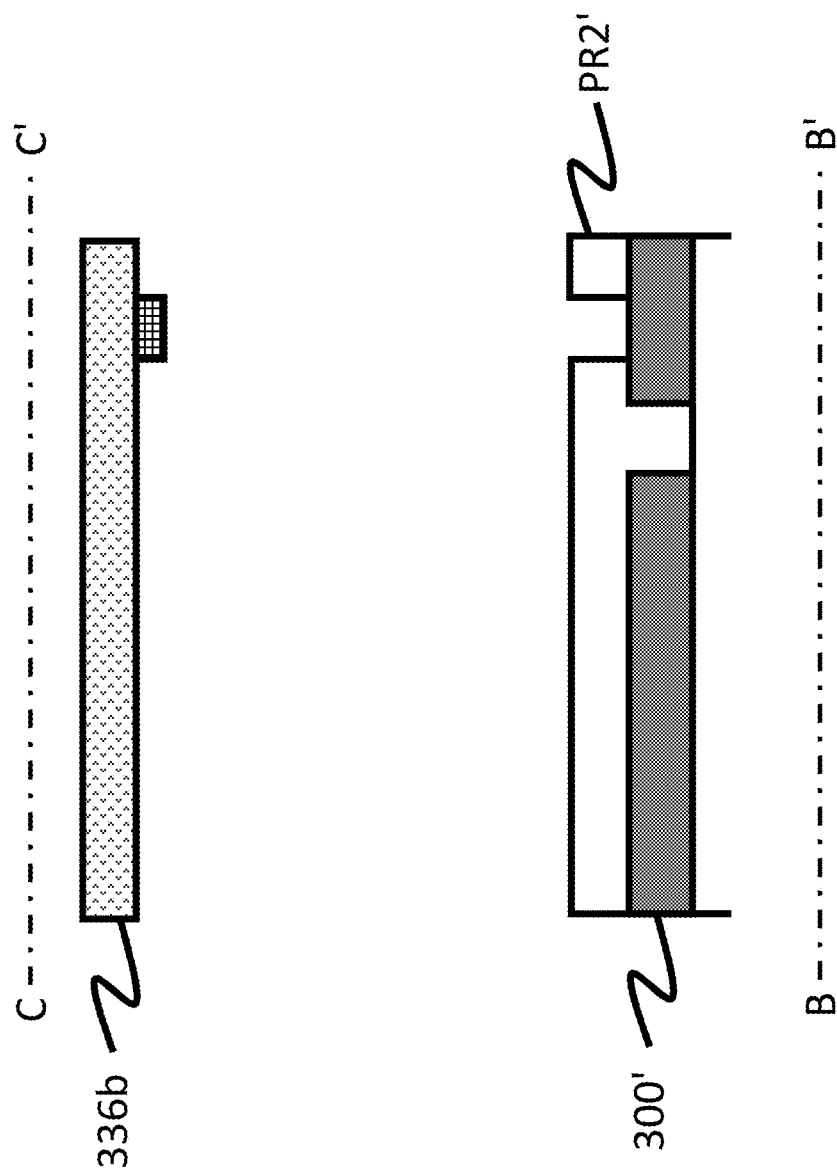

FIGS. 3Q to 3T illustrate the photomask 336b as shown in FIG. 3P is applied. As shown in FIG. 3Q, a second photo resist layer PR2 is formed over the first patterned semiconductor substrate 300'. In some embodiments as shown in FIG. 3R, the second photo resist layer PR2 is irradiated by actinic radiation through the photomask 336b. In some embodiments, a portion of the second photo resist layer PR2 exposed to the actinic radiation is removed. Therefore, a second patterned photo resist layer PR2' is formed.

Figure 3S:
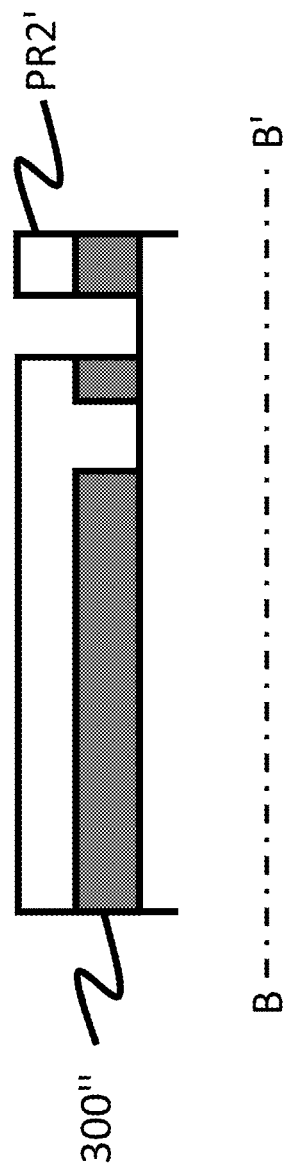
Figure 3U:
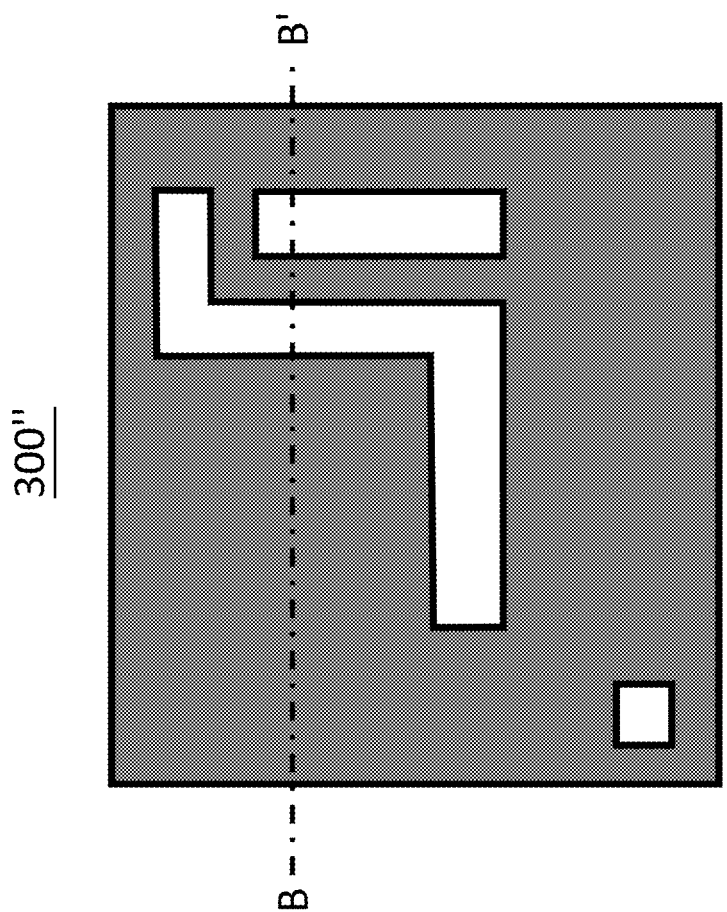

As shown in FIGS. 3S to 3T, the second patterned photo resist layer PR2' is used as a mask for forming a second patterned semiconductor substrate 300". In some embodiments as shown in FIG. 3S, a portion of the first patterned semiconductor substrate 300' exposed from the second patterned photo resist layer PR2' is removed to form the second patterned semiconductor substrate 300". In some embodiments as shown in FIG. 3T, the second patterned photo resist layer PR2' is removed after the formation of the second patterned semiconductor substrate 300".

In some embodiments, after the clip image 720 is processed, another clip image (not shown) of the design layout image 72 is processed by repeating the above operations until the whole design layout image 72 is checked.

It shall be particularly appreciated that the processors mentioned in the above embodiments may be a central processing unit (CPU), other hardware circuit elements capable of executing relevant instructions, or combination of computing circuits that shall be well-appreciated by those skilled in the art based on the above disclosures. Moreover, the storage units mentioned in the above embodiments may be memories for storing data. Further, the I/O interface may be a data transmission interface of a computer. However, it is not intended to limit the hardware implementation embodiments of the present disclosure.

Figure 4A:
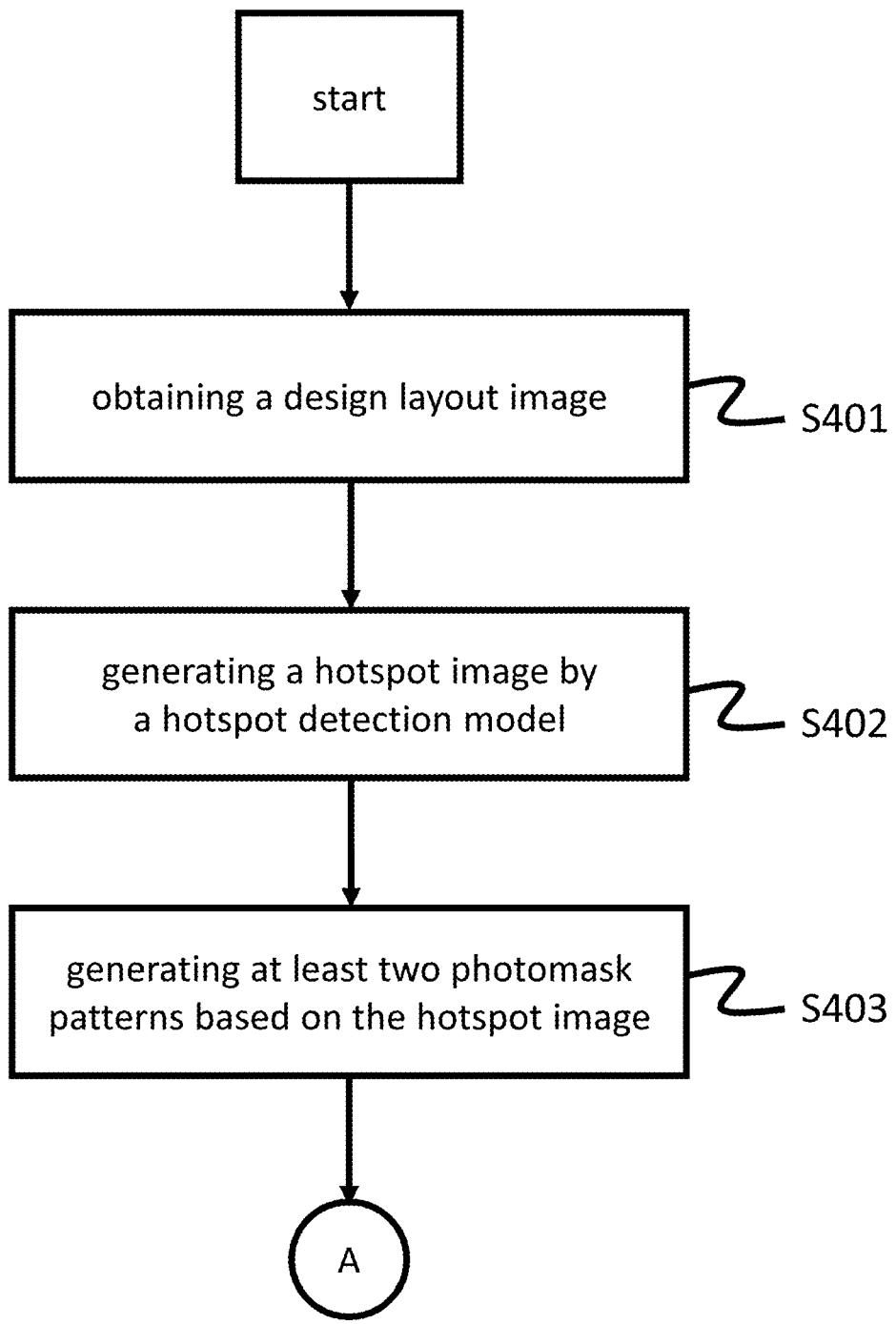
FIGS. 4A to 4C are flowchart diagrams, in accordance with some embodiments of the present disclosure.
Figure 4B:
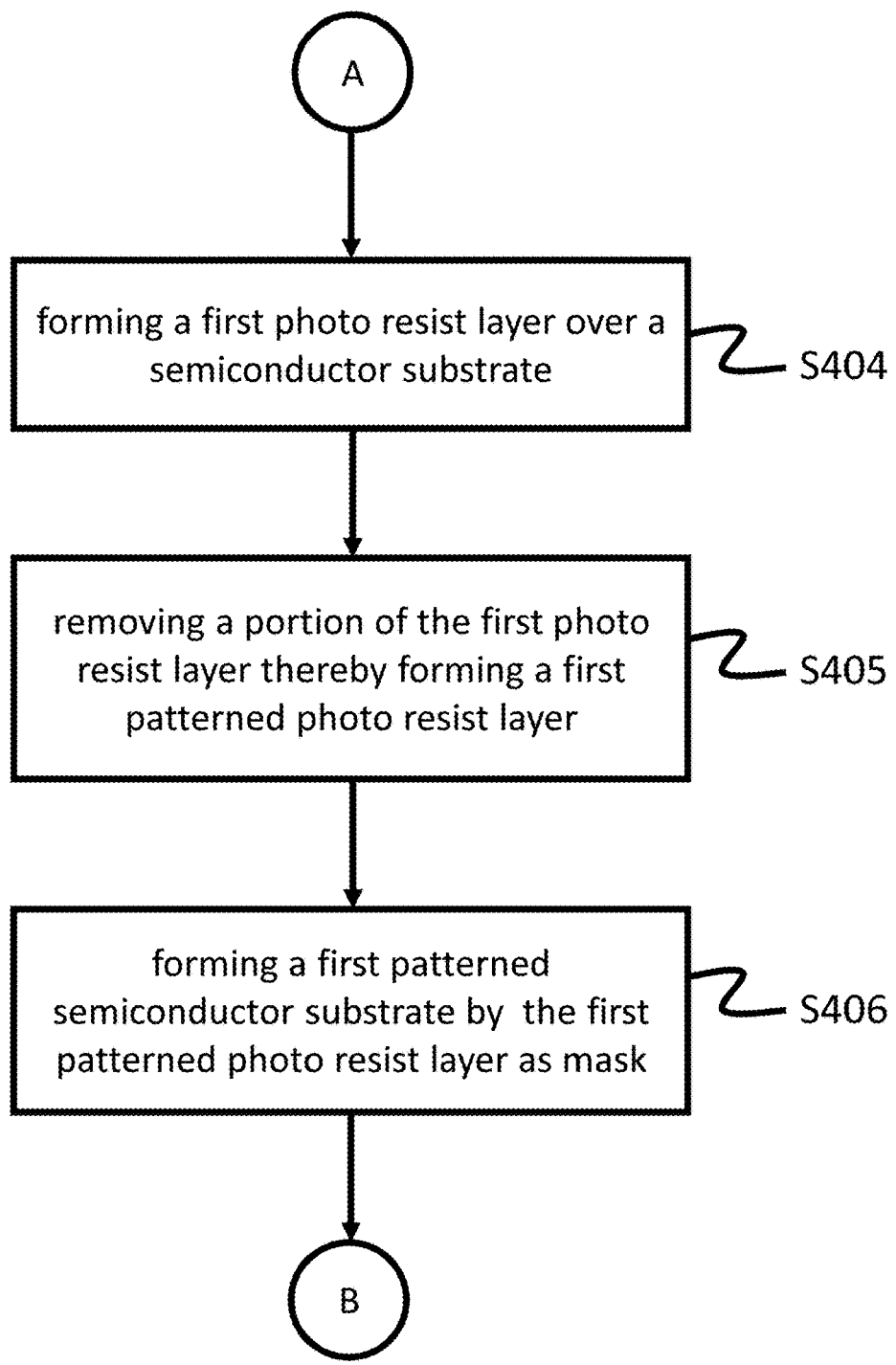
Figure 4C:
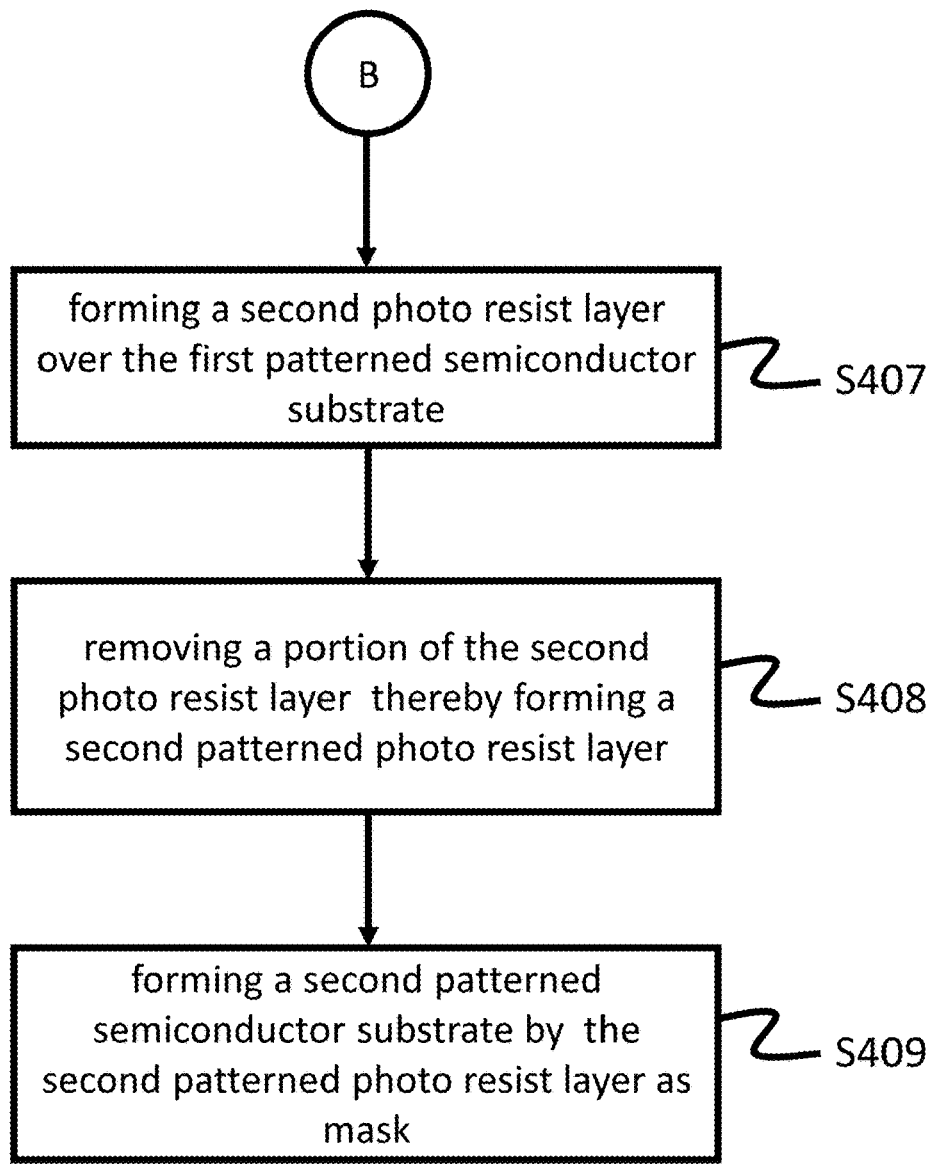

Some embodiments of the present disclosure provide a method as shown in FIGS. 4A to 4C. Operation S401 is executed to obtain a design layout image. After obtaining the design layout image, operation S402 is executed to generate a hotspot image by a hotspot detection model. In operation S402, the hotspot image corresponds to the design layout image and the hotspot image includes at least two hotspot objects. In detail, the design layout image may be inputted into the hotspot detection model to generate the hotspot image. The at least two hotspot objects are adjacent to each other so that a potential hotspot, which may cause a defect in a subsequently fabricated semiconductor substrate, may occur between the hotspot objects. Operation S403 is executed to generate at least two photomask patterns from the hotspot image. In particular, the at least two photomask patterns respectively include the at least two objects. In other words, each of the at least two hotspot objects is formed in one photomask pattern of the at least two photomask patterns.

Operation S404 is executed to form a first photo resist layer over a semiconductor substrate. Operation S405 is executed to remove a portion of the first photo resist layer thereby forming a first patterned photo resist layer. In some embodiments, the portion of the first photo resist layer exposed to actinic radiation through the first photomask is removed. The first photomask includes the one of the at least two photomask patterns. Operation S406 is executed to form a first patterned semiconductor substrate by the first patterned photo resist layer as mask.

Operation S407 is executed to form a second photo resist layer over the first patterned semiconductor substrate. Operation S408 is executed to remove a portion of the second photo resist layer through thereby forming a second patterned photo resist layer. In some embodiments, the portion of the second photo resist layer exposed to actinic radiation through the second photomask is removed. The second photomask includes another one of the at least two photomask patterns. Operation S409 is executed to form a second patterned semiconductor substrate by the second patterned photo resist layer as mask.

Figure 5A:
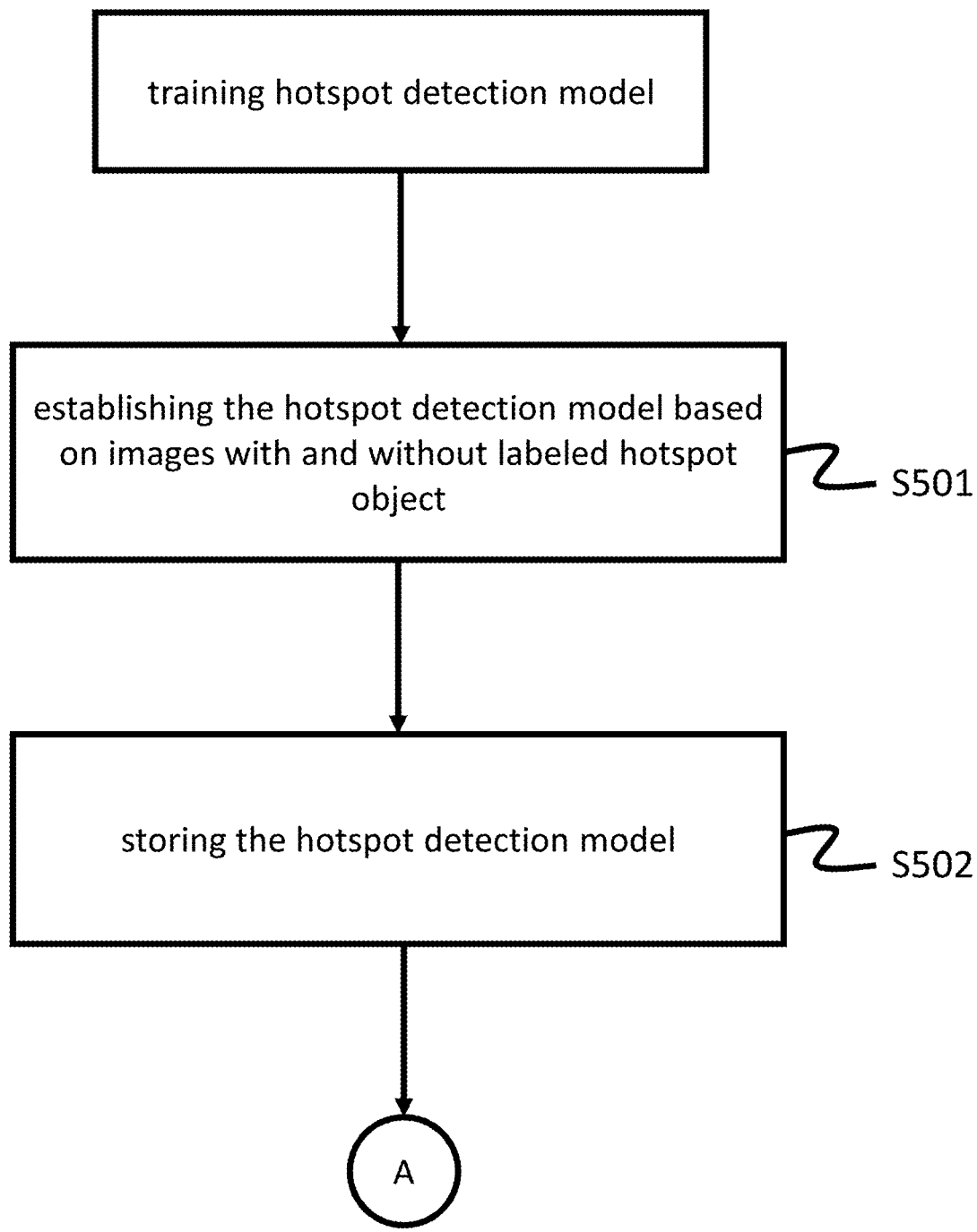
FIGS. 5A to 5C are flowchart diagrams, in accordance with some embodiments of the present disclosure.
Figure 5B:
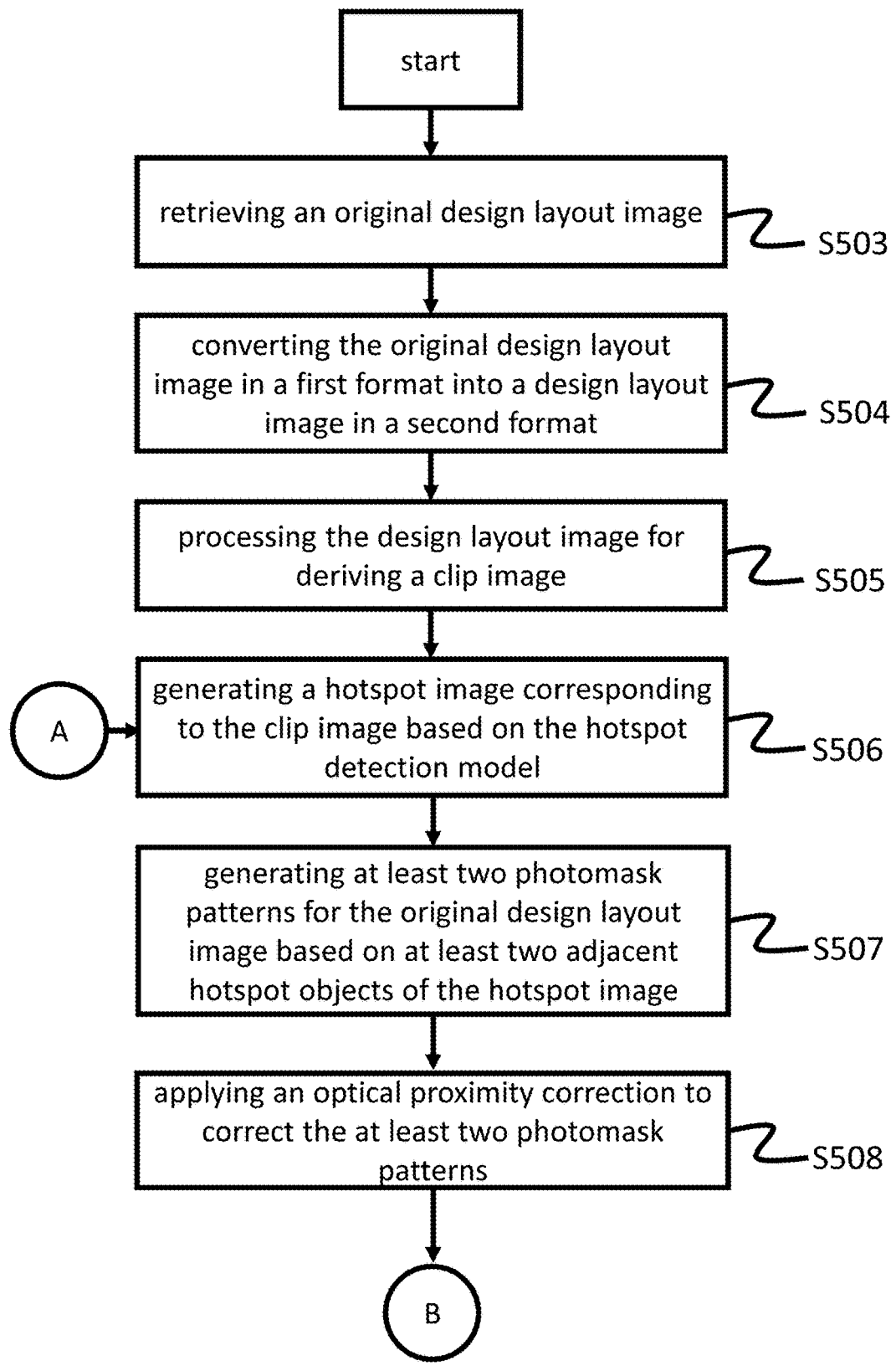
Figure 5C:
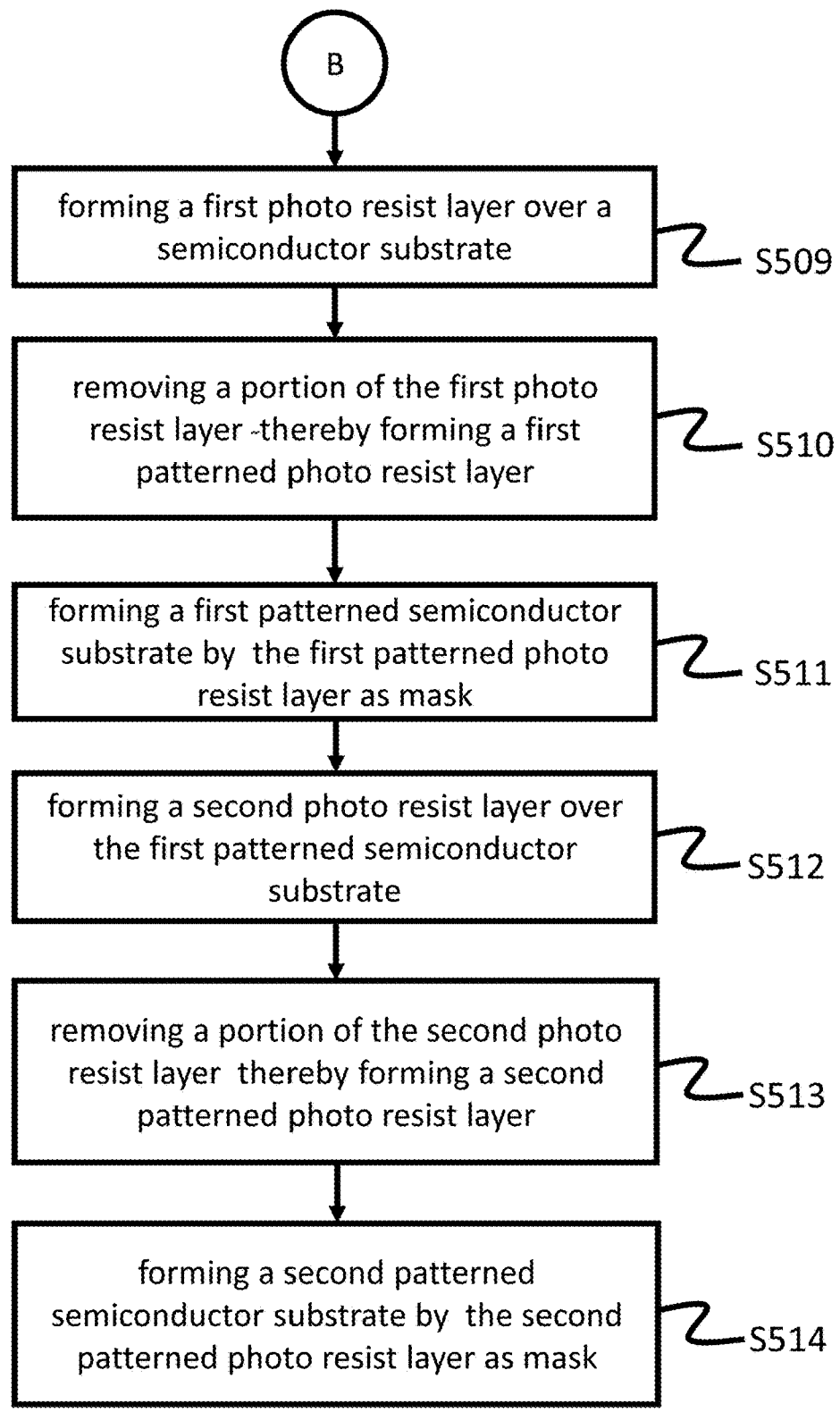

Some embodiments of the present disclosure provide a method as shown in FIGS. 5A to 5C. FIG. 5A is the flowchart diagram of training a hotspot detection model of the method according to some embodiments. Because the hotspot detection model is used for converting images in bitmap format into images labeled with hotspot objects in bitmap format, operation S501 is executed to establish the hotspot detection model by at least one first image, the at least one first image labeled with objects, at least one second image, and the at least one second image without labelling of hotspot object.

During the training of the hotspot detection model, a training function of an algorithm (e.g., FCN for Semantic Segmentation) including a section for receiving two sets of images is used. One of the sets of images includes the first images and the second image which are used as input training data. Another set of images includes the first images labeled with hotspot objects and the second image without labelling of hotspot object, which are used as output training data. Accordingly, the hotspot detection model can be trained after the training function is executed with a main program of the algorithm. It shall be noted that the at least one first image and the at least one second image are both in bitmap format. After establishing the hotspot detection model, operation S502 is executed to store the hotspot detection model for later use.

Referring to FIGS. 5B to 5C, operation S503 is executed to retrieve an original design layout image. The original design layout image may be in a first format (e.g., binary file format). Operation S504 is executed to convert the original design layout image in the first format into a design layout image in a second format (e.g., bitmap format). Operation S505 is executed to process the design layout image for deriving a clip image. Operation S506 is executed to generate a hotspot image corresponding to the clip image by the hotspot detection model. In detail, the hotspot detection model is applied to the clip image of the design layout image to generate the hotspot image. The hotspot image in the second format corresponds to the clip image of the design layout image and includes at least two adjacent hotspot objects.

Operation S507 is executed to generate at least two photomask patterns for the original design layout image according to the at least two adjacent hotspot objects of the hotspot image. In particular, the at least two photomask patterns respectively include the at least two adjacent hotspot objects of the hotspot image. Operation S508 is executed to apply an optical proximity correction to correct the at least two photomask patterns.

Operation S509 is executed to form a first photo resist layer over a semiconductor substrate. Operation S510 is executed to remove a portion of the first photo resist layer thereby forming a first patterned photo resist layer. In some embodiments, the portion of the first photo resist layer exposed to actinic radiation through the first photomask is removed. The first photomask includes the one of the at least two photomask patterns. Operation S511 is executed to form a first patterned semiconductor substrate by the first patterned photo resist layer as mask.

Operation S512 is executed to form a second photo resist layer over the first patterned semiconductor substrate. Operation S513 is executed to remove a portion of the second photo resist layer thereby forming a second patterned photo resist layer. In some embodiments, the portion of the second photo resist layer exposed to actinic radiation through the second photomask is removed. The second photomask includes another one of the at least two photomask patterns. Operation S514 is executed to form a second patterned semiconductor substrate by the second patterned photo resist layer as mask.

Figure 6:
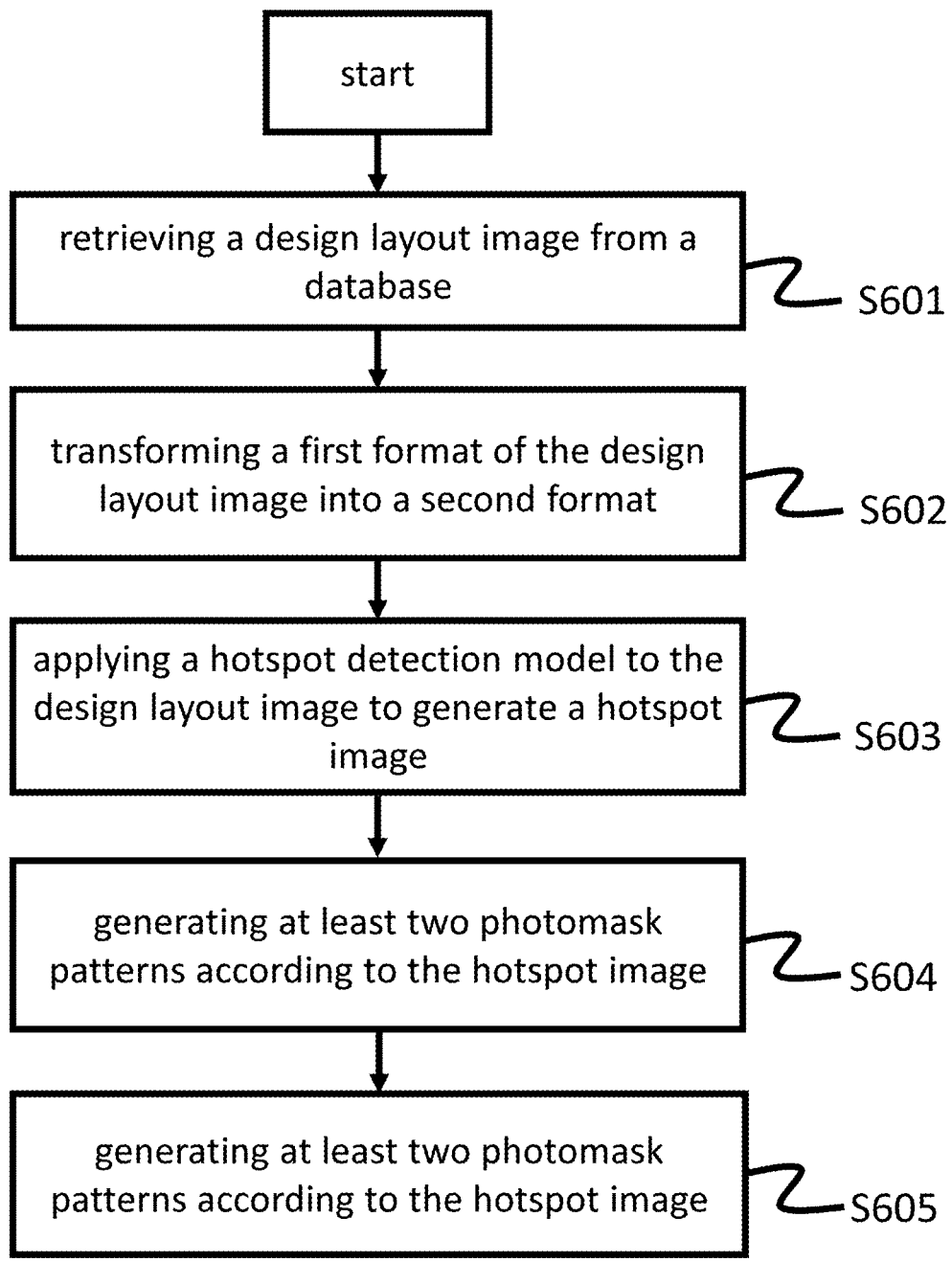
FIG. 6 is a flowchart diagram, in accordance with some embodiments of the present disclosure.

Some embodiments of the present disclosure provide a method as shown in FIG. 6. Operation S601 is executed to retrieve a design layout image from a database. Operation S602 is executed to transform a first format of the design layout image into a second format. The second format may be different from the first format. Operation S603 is executed to apply a hotspot detection model to the design layout image to generate a hotspot image.

Operation S604 is executed to generate at least two photomask patterns according to the hotspot image. In detail, one of the at least two photomask patterns includes a first object, and another of the at least two photomask patterns includes a second object. Operation S605 is executed to manufacture at least two photomasks according to the at least two photomask patterns. The at least two photomasks respectively have the at least two photomask patterns.

In some embodiments, the hotspot image includes one original object which may have a shape that causes hotspot (e.g., an "U" shape that may cause a hotspot between two ends of the "U" shape). In these embodiments, this original object may be separated as the first object of one of the at least two photomask patterns and the second object of another of the at least two photomask patterns. In some embodiments, the hotspot image includes two original objects which may cause hotspot therebetween. In these embodiments, one of the original objects corresponds to the first object of one of the at least two photomask patterns, and another of the original objects corresponds the second object of another of the at least two photomask patterns.

Figure 7A:
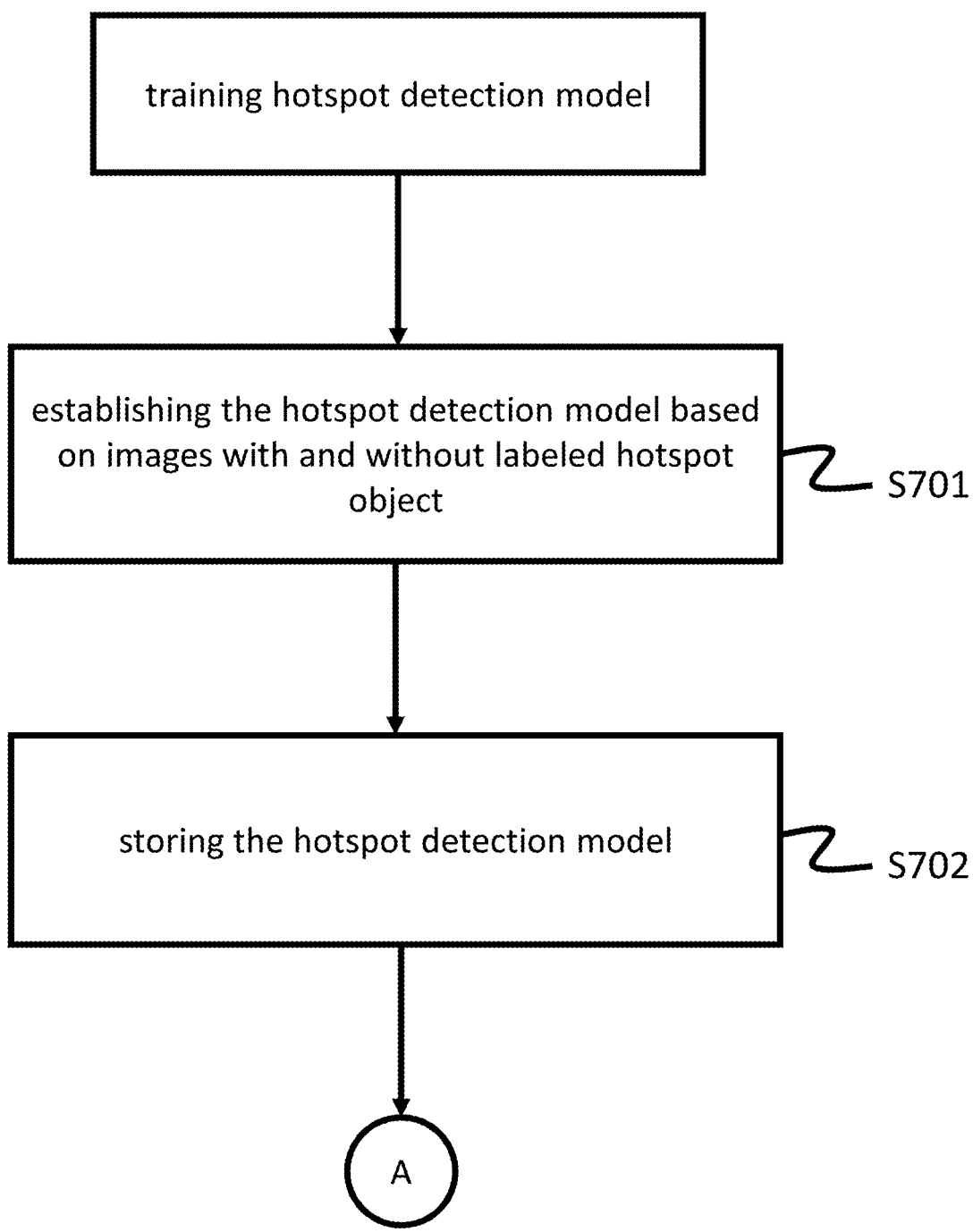
FIGS. 7A to 7B are flowchart diagrams, in accordance with some embodiments of the present disclosure.
Figure 7B:
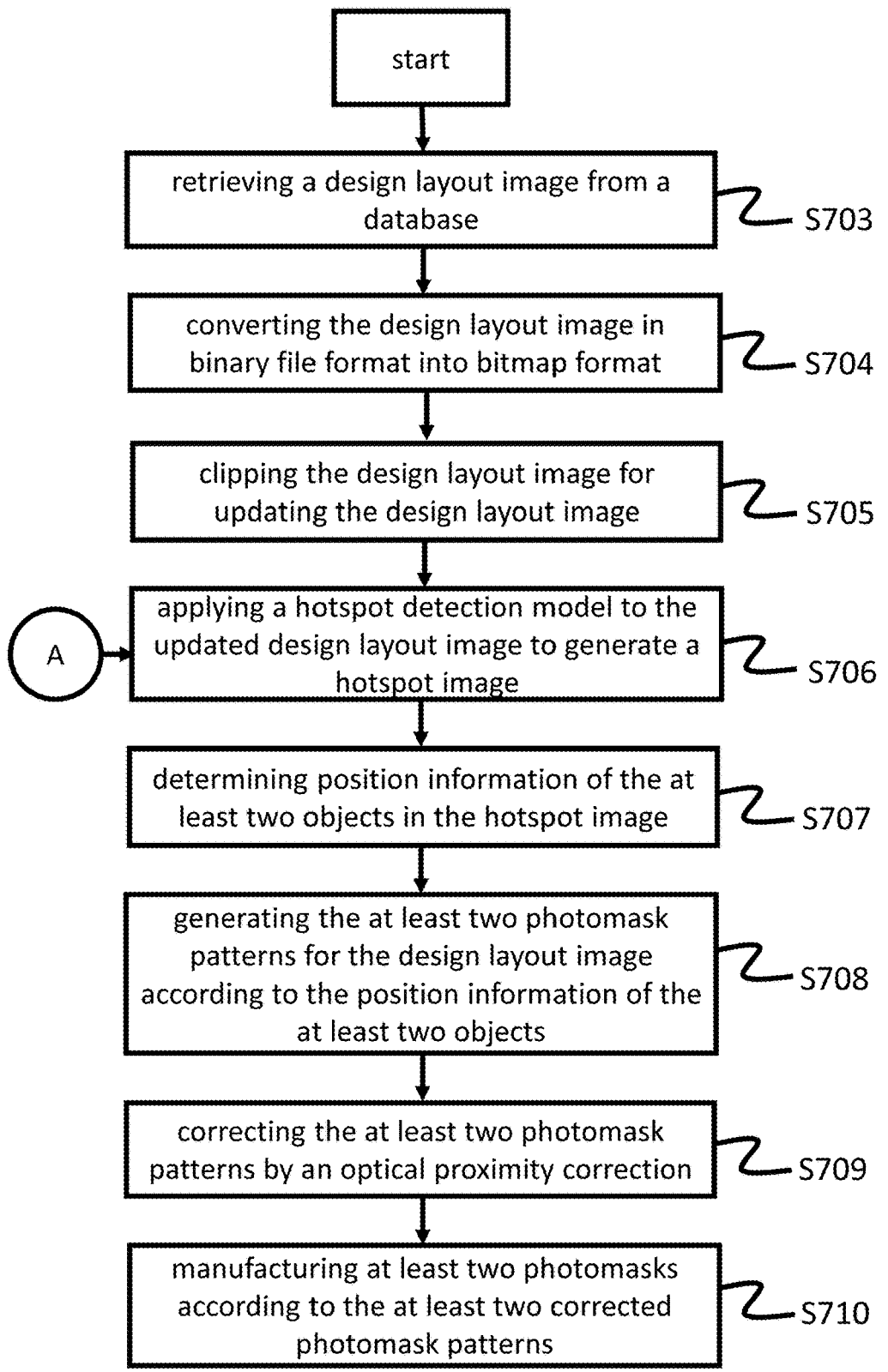

Some embodiments of the present disclosure include a method as shown in FIGS. 7A to 7B. FIG. 7A is the flowchart diagram of training a hotspot detection model of the method according to some embodiments. Because the hotspot detection model is used for converting images in bitmap format into images labeled with hotspot objects in bitmap format, operation S601 is executed to establish the hotspot detection model by at least one first image, the at least one first image labeled with objects, at least one second image, and the at least one second image without labelling of hotspot object.

During the training of the hotspot detection model, a training function of an algorithm (e.g., FCN for Semantic Segmentation) including a section for receiving two sets of images is used. One of the sets of images includes the first images and the second image which are used as input training data. Another set of images includes the first images labeled with hotspot objects and the second image without labelling of hotspot object, which are used as output training data. Accordingly, the hotspot detection model can be trained after the training function is executed with a main program of the algorithm. It shall be noted that the at least one first image and the at least one second image are both in bitmap format. After establishing the hotspot detection model, operation S602 is executed to store the hotspot detection model for later use.

Referring to FIG. 7B, operation S703 is executed to retrieve a design layout image from a database. The design layout image is in binary format. Operation S704 is executed to convert the design layout image in binary file format into bitmap format. Operation S705 is executed to clip the design layout image for updating the design layout image. Operation S706 is executed to apply a hotspot detection model to the updated design layout image to generate a hotspot image. In some embodiments, the hotspot image includes at least two objects.

Operation S707 is executed to determine position information of the at least two objects in the hotspot image. Operation S708 is executed to generate the at least two photomask patterns for the design layout image according to the position information of the at least two objects. The at least two photomask patterns respectively include the at least two objects. Operation S709 is executed to correct the at least two photomask patterns by an optical proximity correction. Operation S710 is executed to manufacture at least two photomasks according to the at least two corrected photomask patterns. The at least two corrected photomask patterns respectively have the at least two photomask patterns.

The photomask pattern generating method described in each of the above embodiments may be implemented by a computer programs including a plurality of codes. The computer program is stored in a non-transitory computer readable storage medium. When the computer program is loaded into an electronic computing apparatus (e.g., the systems mentioned in the above embodiments), the computer program executes the photomask pattern generating method as described in the above embodiment. The non-transitory computer readable storage medium may be an electronic product, e.g., a read only memory (ROM), a flash memory, a floppy disk, a hard disk, a compact disk (CD), a mobile disk, a database accessible to networks, or any other storage media having the same function and being well known to those of ordinary skill in the art.

Through the use of the machine learning model, the potential hotspot can be detected and defect of the subsequent semiconductor substrate can be proactively prevented, and the precision of the detection is more reliable.

Some embodiments of the present disclosure provide a method. The method includes the operations of: obtaining a design layout image; generating a hotspot image corresponding to the design layout image based on a hotspot detection model, wherein the hotspot image comprises at least two adjacent hotspot objects; generating at least two photomask patterns based on the hotspot image, wherein the at least two photomask patterns respectively comprise the at least two adjacent hotspot objects; and transferring the at least two photomask patterns onto a semiconductor substrate.

Some embodiments of the present disclosure provide a method. The method includes the operations of: retrieving a design layout image from a database; transforming a first format of the design layout image into a second format; applying a hotspot detection model to the design layout image to generate a hotspot image, wherein the hotspot image comprises at least two objects; generating at least two photomask patterns based on the hotspot image, wherein the at least two photomask patterns respectively comprise the at least two objects; manufacturing at least two photomasks according to the at least two photomask patterns.

Some embodiments of the present disclosure provide a system. The system includes a storage unit and a processor. The storage unit is configured to store a hotspot detection model. The processor is configured to: obtain a design layout image; input the design layout image to the hotspot detection model for outputting an image including a first hotspot object and a second hotspot object, wherein a first spacing between the hotspot first object and the second object is smaller than a threshold; and generate a first photomask pattern and a second photomask pattern based on the first hotspot object and the second hotspot object of the image, wherein the first photomask pattern includes the first hotspot object and the second photomask pattern includes the second hotspot object.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method, comprising:
    obtaining a design layout image;
    generating a hotspot image corresponding to the design layout image based on a hotspot detection model, wherein the hotspot image comprises at least two adjacent hotspot objects;
    generating at least two photomask patterns based on the hotspot image, wherein the at least two photomask patterns respectively comprise the at least two adjacent hotspot objects;
    forming a first photo resist layer over a semiconductor substrate;
    exposing the first photo resist layer to actinic radiation through a first photomask;
    removing a portion of the first photo resist layer thereby forming a first patterned photo resist layer, wherein the first photomask includes one of the at least two photomask patterns;
    forming a first pattern to a layer of the semiconductor substrate by the first patterned photo resist layer;
    forming a second photo resist layer over the layer of the semiconductor substrate;
    exposing the second photo resist layer to actinic radiation through a second photomask;
    removing a portion of the second photo resist layer thereby forming a second patterned photo resist layer, wherein the second photomask includes another one of the at least two photomask patterns; and
    forming a second pattern to the same layer of the semiconductor substrate by the second patterned photo resist layer.

2. The method of claim 1, wherein obtaining the design layout image further comprises:
    retrieving an original design layout image; and
    converting the original design layout image in a first format into the design layout image in a second format different from the first format,
    wherein the hotspot image is generated in the second format.

3. The method of claim 2, wherein generating the at least two photomask patterns further comprises:
    generating the at least two photomask patterns for the original design layout image based on the at least two adjacent hotspot objects of the hotspot image.

4. The method of claim 3, further comprising:
    processing the design layout image for deriving a clip image, wherein the clip image is part of the design layout image,
    wherein generating the hotspot image further comprises:
    generating the hotspot image corresponding to the clip image of the design layout image based on the hotspot detection model.

5. The method of claim 1, further comprising:
    establishing the hotspot detection model based on at least one first image and the at least one first image with labeled hotspot objects.

6. The method of claim 5, wherein establishing the hotspot detection model further comprises:
    establishing the hotspot detection model based on the at least one first image, the at least one first image labeled with hotspot objects, at least one second image, and the at least one second image without labelling of hotspot object.

7. The method of claim 1, further comprising:
    applying an optical proximity correction to correct the at least two photomask patterns.

8. The method of claim 1, wherein removing the portion of the first photo resist layer comprises:
    removing the portion of the first photo resist layer exposed to actinic radiation through the first photomask.

9. The method of claim 1, wherein removing the portion of the second photo resist layer further comprises:
    removing the portion of the second photo resist layer exposed to actinic radiation through the second photomask.

10. A method, comprising:
    retrieving a design layout image from a database;
    applying a hotspot detection model to the design layout image to generate a hotspot image corresponding to the design layout image, wherein the hotspot image comprises at least two hotspot objects;
    generating at least two photomask patterns based on the hotspot image, wherein one of the at least two photomask patterns comprises a first object and another of the at least two photomask patterns comprises a second object;
    forming a first photo resist layer over a semiconductor substrate;
    exposing the first photo resist layer to actinic radiation through a first photomask;
    removing a portion of the first photo resist layer thereby forming a first patterned photo resist layer, wherein the first photomask includes the one of the at least two photomask patterns;
    forming a first pattern to a layer of the semiconductor substrate by the first patterned photo resist layer;
    forming a second photo resist layer over the layer of the semiconductor substrate;
    exposing the second photo resist layer to actinic radiation through a second photomask;

removing a portion of the second photo resist layer thereby forming a second patterned photo resist layer, wherein the second photomask includes the another of the at least two photomask patterns; and forming a second pattern to the same layer of the semiconductor substrate by the second patterned photo resist layer.

11. The method of claim 10, further comprising: transforming a first format of the design layout image into a second format.

12. The method of claim 10 generating the at least two photomask patterns further comprising:

determining position information of the first object and the second object corresponding to the hotspot image; and generating the at least two photomask patterns for the design layout image based on the position information.

13. The method of claim 10, further comprising:

updating the design layout image by a clip of the design layout image.

14. The method of claim 10, wherein the hotspot detection model is trained based on a machine learning scheme with training data of a plurality of first images and the plurality of first images labeled with hotspot objects.

15. The method of claim 14, wherein the hotspot detection model is further trained based on the machine learning scheme with training data of the plurality of first images, the plurality of first images labeled with hotspot objects, a plurality of second images, and the plurality of second images without labelling of hotspot object.

16. The method of claim 10, further comprising:

correcting the at least two photomask patterns by an optical proximity correction.

17. A system, comprising:

a storage unit, being configured to store a hotspot detection model; and a processor, being connected to the storage unit electrically and configured to:

obtain a design layout image;

input the design layout image to the hotspot detection model for outputting a hotspot image corresponding to the design layout image, wherein the hotspot image comprises a first object and a second object;

generate, based on the hotspot image, a first photomask pattern including the first object, wherein the first photomask pattern is transferred to a layer of a semiconductor substrate for forming a first pattern to the semiconductor substrate by forming a first photo resist layer over the semiconductor substrate;

exposing the first photo resist layer to actinic radiation through a first photomask;

removing a portion of the first photo resist layer according to the first photomask pattern thereby forming a first patterned photo resist layer, wherein the first photomask includes the first photomask pattern;

forming the first pattern to the layer of the semiconductor substrate by the first patterned photo resist layer;

generate, based on the hotspot image, a second photomask pattern including the second object, wherein the second photomask pattern is transferred to the same layer of the semiconductor substrate for forming a second pattern to the semiconductor substrate by forming a second photo resist layer over the layer of the semiconductor substrate;

exposing the second photo resist layer to actinic radiation through a second photomask;

removing a portion of the second photo resist layer thereby forming a second patterned photo resist layer, wherein the second photomask includes the second photomask pattern; and forming the second pattern to the same layer of the semiconductor substrate by the second patterned photo resist layer.

18. The system of claim 17, further comprising: an I/O interface, being connected to the processor electrically, and configured to retrieve the design layout image from a database.

19. The system of claim 17, wherein the processor is further configured to convert a first format of the design layout image into a second format.

20. The system of claim 17, wherein the processor is further configured to process the design layout image by clipping the design layout image.

* * * * *